(12) United States Patent
Lee

(10) Patent No.: US 9,356,036 B2
(45) Date of Patent: May 31, 2016

(54) SEMICONDUCTOR APPARATUS AND MANUFACTURING METHOD OF THE SAME

(71) Applicant: SK hynix Inc., Icheon-si Gyeonggi-do (KR)

(72) Inventor: Sang Bum Lee, Incheon (KR)

(73) Assignee: SK HYNIX INC., Icheon-Si (KR)

( * ) Notice: Subject to any disclaimer, the term of this patent is extended or adjusted under 35 U.S.C. 154(b) by 0 days.

(21) Appl. No.: 14/488,879

(22) Filed: Sep. 17, 2014

(65) Prior Publication Data

US 2015/0287739 A1    Oct. 8, 2015

(30) Foreign Application Priority Data

Apr. 7, 2014   (KR) .................. 10-2014-0041146

(51) Int. Cl.
*H01L 27/115*   (2006.01)

(52) U.S. Cl.
CPC ...... *H01L 27/1157* (2013.01); *H01L 27/11573* (2013.01); *H01L 27/11575* (2013.01); *H01L 27/11582* (2013.01)

(58) Field of Classification Search
CPC ................. H01L 29/66833; H01L 29/4283

USPC ........................................... 257/326; 438/269
See application file for complete search history.

(56) References Cited

U.S. PATENT DOCUMENTS

| | | | | |
|---|---|---|---|---|
| 2013/0153978 | A1* | 6/2013 | Lee ................... | H01L 29/66833 257/314 |
| 2013/0240994 | A1* | 9/2013 | Lee ..................... | H01L 29/4238 257/364 |
| 2015/0041901 | A1* | 2/2015 | Son .................... | G11C 16/0483 257/368 |

FOREIGN PATENT DOCUMENTS

| | | |
|---|---|---|
| KR | 1020110086405 A | 7/2011 |
| KR | 1020130005430 A | 1/2013 |
| KR | 1020130070922 A | 6/2013 |

* cited by examiner

*Primary Examiner* — Cuong Q Nguyen
*Assistant Examiner* — Tong-Ho Kim
(74) *Attorney, Agent, or Firm* — William Park & Associates Ltd.

(57) ABSTRACT

A semiconductor apparatus according to an embodiment may include a first pipe gate divided by an isolation layer, a first pipe channel layer buried in the first pipe gate, a second pipe gate covering the first pipe channel layer, the first pipe gate and the isolation layer and a second pipe channel layer buried in the second pipe gate.

14 Claims, 20 Drawing Sheets

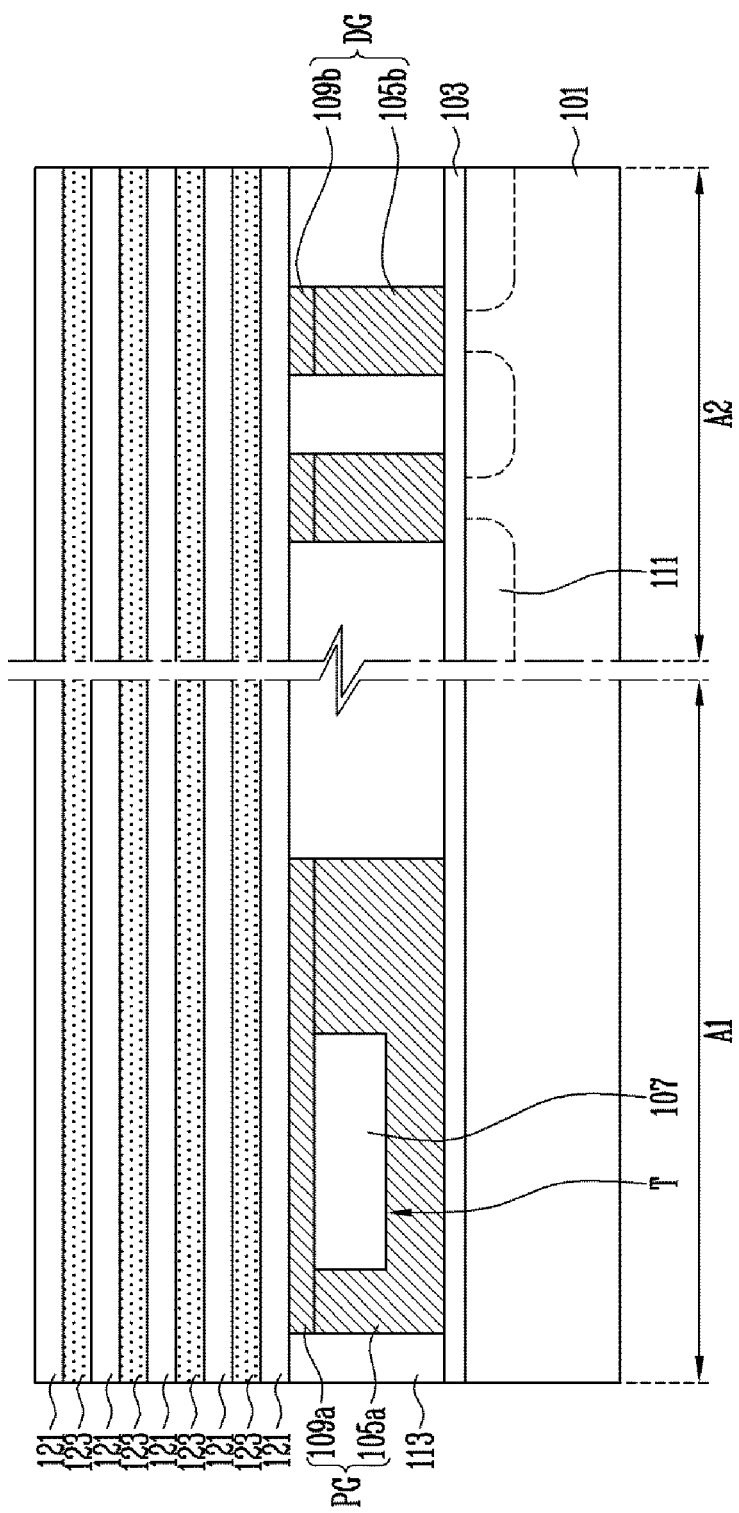

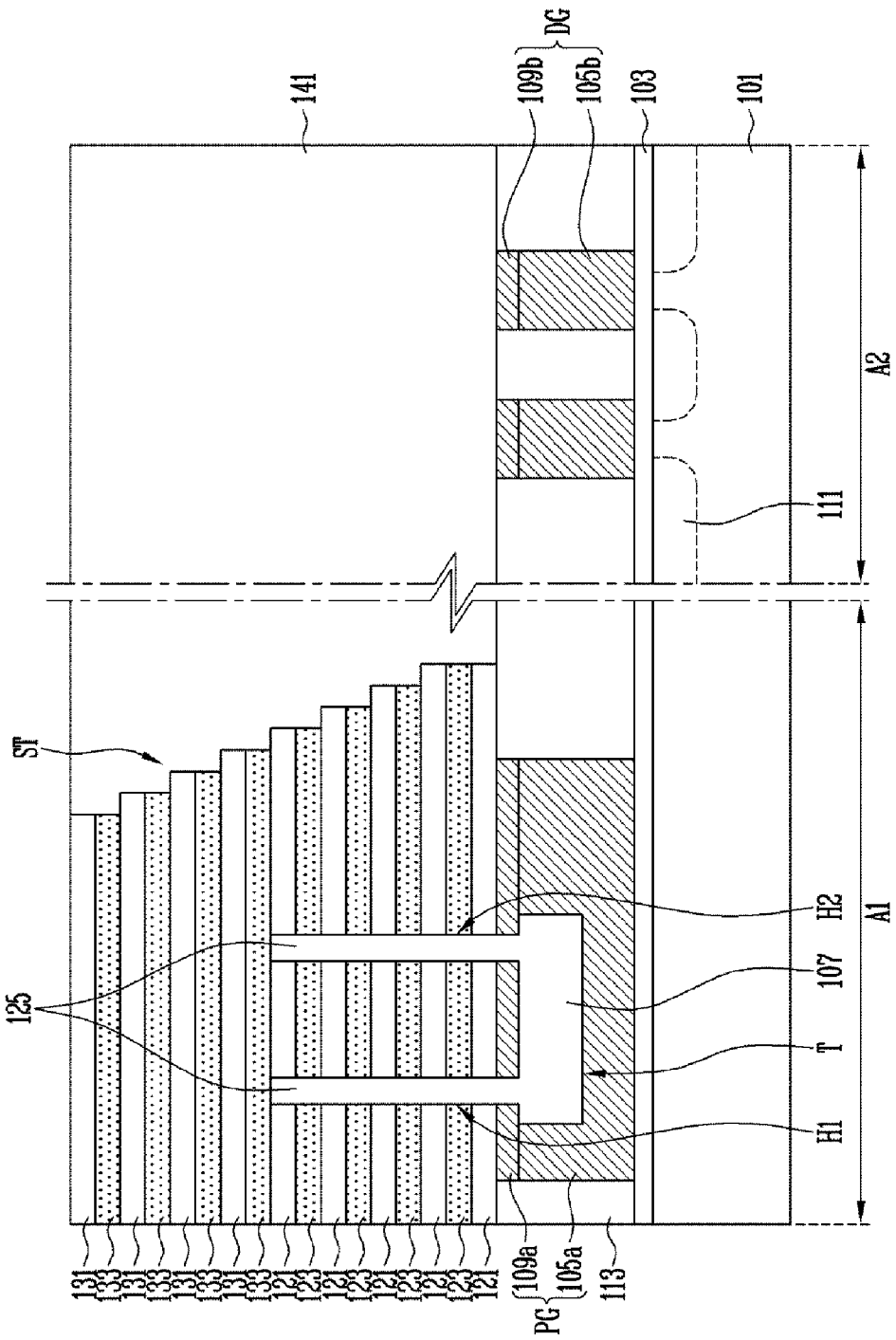

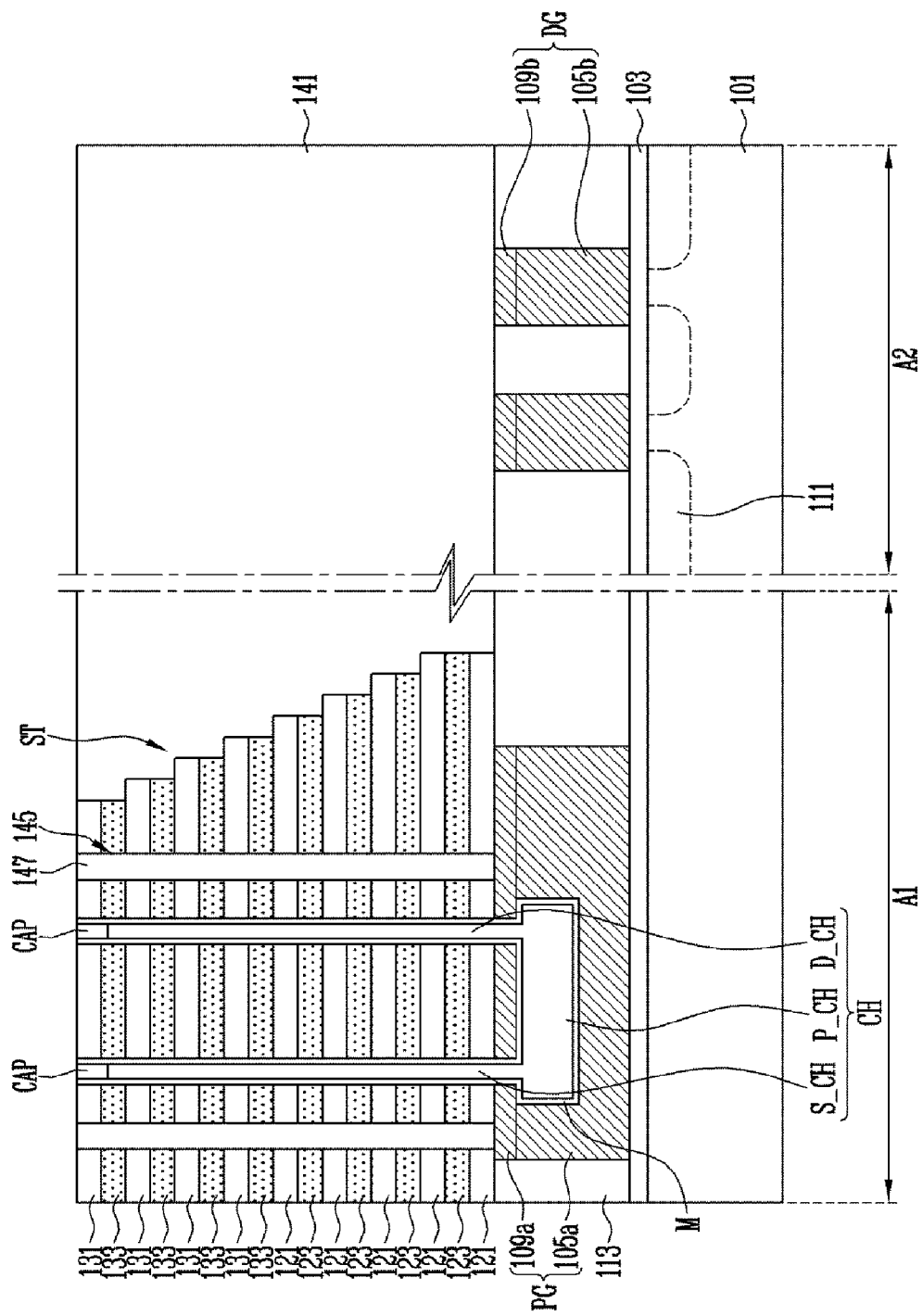

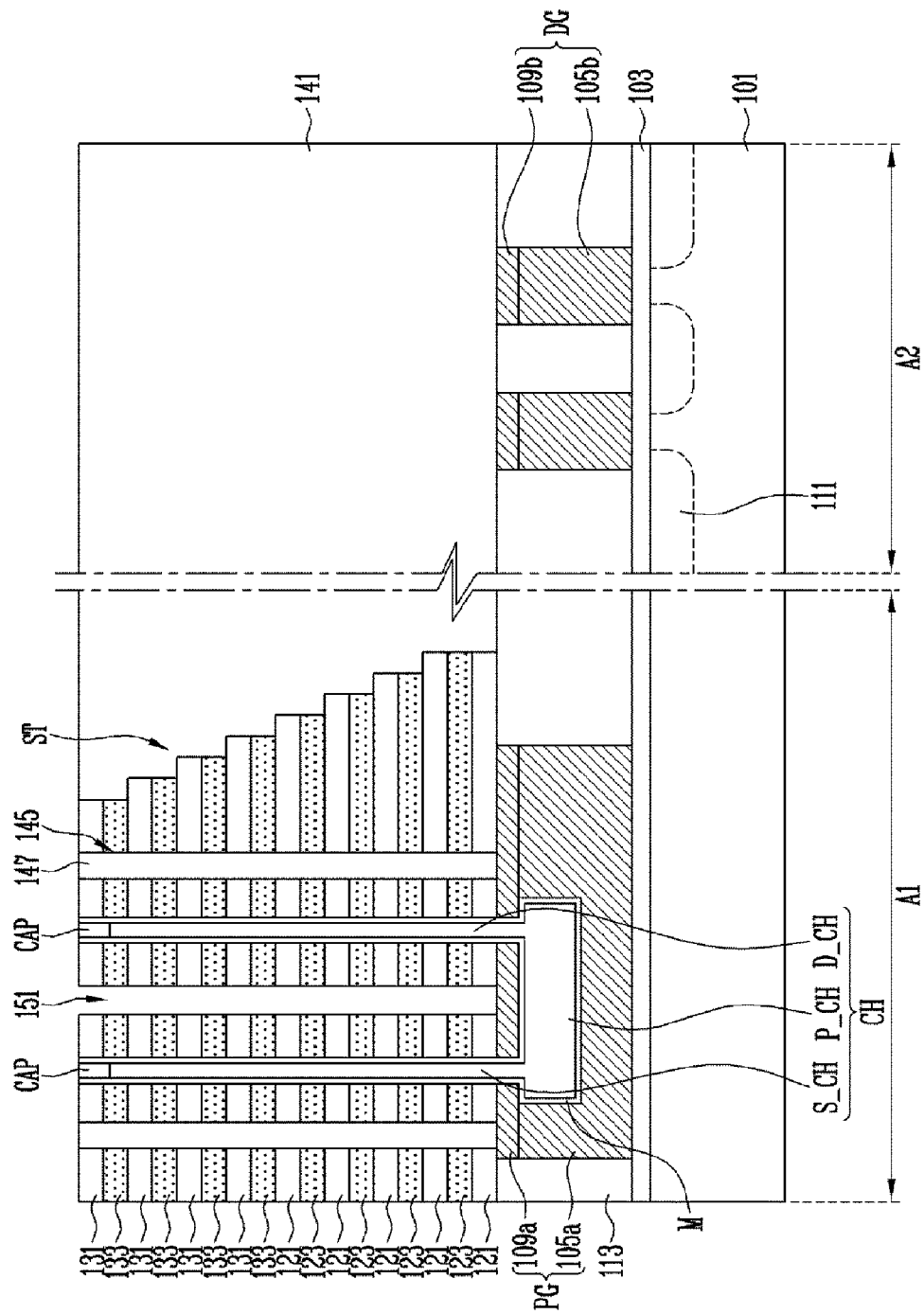

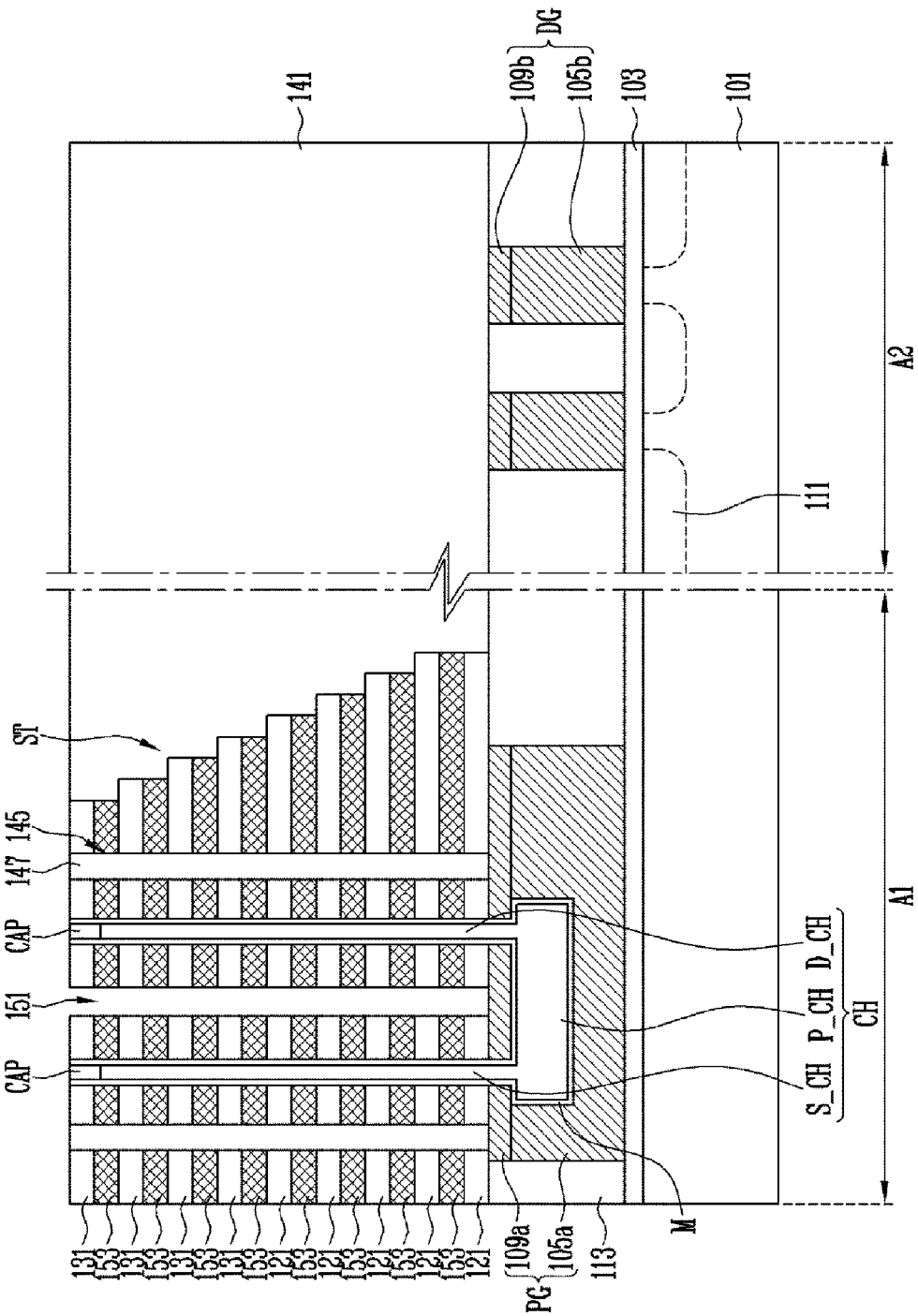

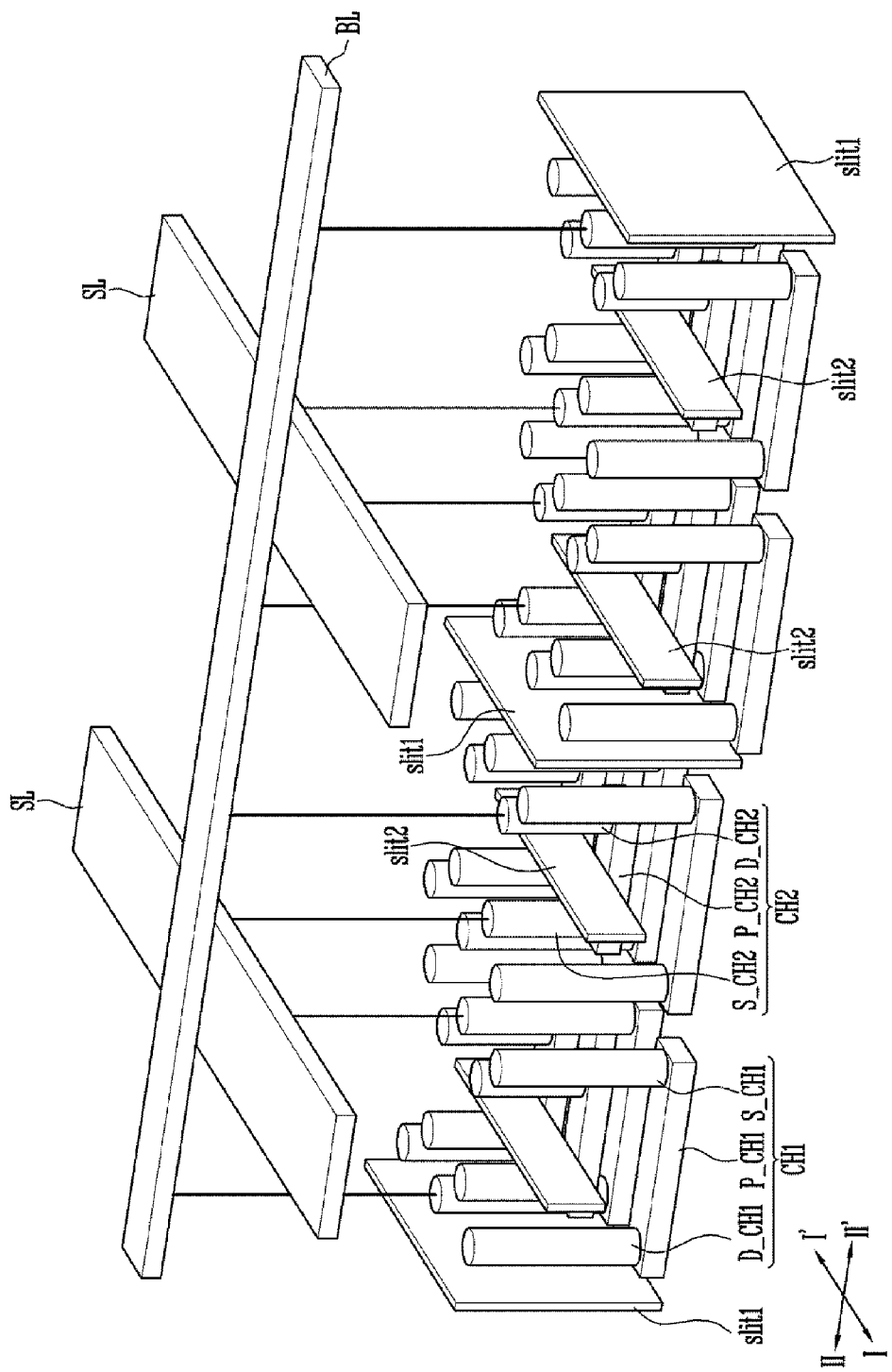

SEMICONDUCTOR APPARATUS AND MANUFACTURING METHOD OF THE SAME

CROSS-REFERENCE TO RELATED APPLICATION

The present application claims priority to Korean patent application number 10-2014-0041146 filed on Apr. 7, 2014, in the Korean Intellectual Property Office, the entire disclosure of which is incorporated by reference herein.

BACKGROUND

1. Technical Field

Embodiments relate to a semiconductor apparatus and a manufacturing method of the same.

2. Related Art

A semiconductor apparatus may include a memory device for storing data. The memory device may include a memory cell array region where memory cell strings are arranged and a peripheral circuit region where a peripheral circuit for driving the memory cell strings is arranged.

For high integration of the semiconductor apparatus, a three-dimensional memory device has been proposed, where memory cells are arranged in a three dimension by stacking memory cells, which make up memory cell strings, on a substrate. Technology has been recently developed to further improve the degree of integration of such three-dimensional memory device.

SUMMARY

A semiconductor apparatus according to an embodiment may include a first pipe gate divided by an isolation layer. A first pipe channel layer may be buried in the first pipe gate. In addition, a second pipe gate may be covering the first pipe channel layer, the first pipe gate and the isolation layers. Further, a second pipe channel layer may be buried in the second pipe gate.

A method for manufacturing a semiconductor apparatus according to an embodiment may include forming a first pipe gate divided by a isolation layer with a first sacrificial layer buried in the first pipe gate. The method may also include forming a second pipe gate covering the first sacrificial layer, the first pipe gate and the isolation layers with a second sacrificial layer buried in the second pipe gate.

BRIEF DESCRIPTION OF THE DRAWINGS

FIGS. 2A through 2G are cross-sectional views illustrating a method for manufacturing a semiconductor apparatus according to an embodiment;

FIGS. 3A through 3C are views illustrating a semiconductor apparatus according to an embodiment;

DETAILED DESCRIPTION

Hereinafter, various embodiments will be described in detail with reference to the accompanying figures. The figures are provided to allow those having ordinary skill in the art to understand the scope of the embodiments of the disclosure. The invention may, however, be embodied in different forms and should not be construed as limited to the embodiments set forth. Rather, these embodiments are provided so that this disclosure will be thorough and complete, and fully convey the scope of the invention to those skilled in the art.

Figure 1:
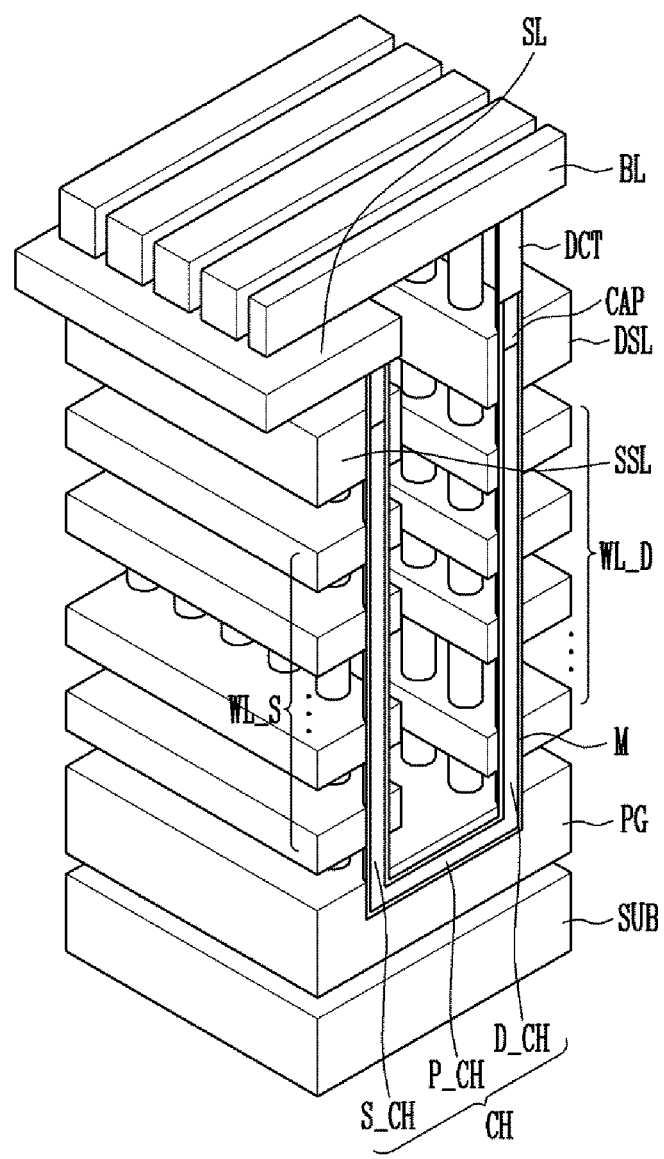
FIG. 1 is a perspective view illustrating a semiconductor apparatus according to an embodiment.

Referring to FIG. 1, a perspective view illustrating a semiconductor apparatus according to an embodiment. For convenience, insulating layers are not shown in FIG. 1. Furthermore, FIG. 1 shows a cell array region.

As shown in FIG. 1, the semiconductor apparatus according to an embodiment may include a channel layer CH, a pipe gate PG, word lines WL_D and WL_S, at least one source select line SSL, and at least one drain select line DSL.

The word lines WL_D and WL_S may include source side word lines WL_S and drain side word lines WL_D. The source side word lines WL_S may be stacked between the source select line SSL and the pipe gate PG. Further, drain side word lines WL_D may be stacked between the drain select line DSL and the pipe gate PG. The pipe gate PG may be provided over the substrate SUB.

The channel layer CH may include a pipe channel layer P_CH, a source side channel layer S_CH and a drain side channel layer D_CH. The source side channel layer S_CH and the drain side channel layer D_CH protrude from the pipe channel layer P_CH. Although a pair of source side channel layers S_CH and a pair of drain side channel layers D_CH are shown to be electrically coupled to the pipe channel layer P_CH as an example, two or more source side channel layers S_CH may be electrically coupled to the pipe channel layer P_CH. In the alternative, two or more drain side channel layers D_CH may be electrically coupled to the pipe channel layer P_CH depending on a shape of a memory string.

The pipe channel layer P_CH may be buried in the pipe gate PG. The source side channel layer S_CH may pass through the source side word lines WL_S and the source select line SSL. The drain side channel layer D_CH may pass through the drain side word lines WL_D and the drain select line DSL.

The channel layer CH may be formed in a through-hole passing through the pipe gate PG, the word lines WL_D and WL_S, at least one source select line SSL and at least one drain select line DSL. The channel layer CH may be formed in a tube shape along a surface of the through-hole to open a central region of the through-hole. The channel layer CH may be formed in a buried shape in which the through-hole is buried up to the central region of the through-hole. The channel layer CH may be formed in a mixed shape, combining both the tube shape and the buried shape. If the channel layer CH is of the tube shape, the open central region of an upper part of the channel layer CH may be filled with a capping conductive layer CAP. Or impurities may be doped on the upper part of the channel layer CH and the capping conductive layer CAP may be formed as a result. The capping conductive layer CAP of an upper part of the source side channel layer S_CH may be used as a source region. In addition, the capping conductive layer CAP of an upper part of the drain side channel layer D_CH may be used as a drain region.

The source side channel layer S_CH may be electrically coupled to a source line SL, and the drain side channel layer D_CH may be electrically coupled to a bit line BL. The drain side channel layer D_CH may be electrically coupled to the bit line BL via a drain contact plug DCT.

The channel layer CH may be surrounded by a multi-layer insulation film M. The multi-layer insulation film M may include any one of a tunnel insulating layer, a data storage layer and a blocking insulating layer. The tunnel insulating layer may come in contact with the channel layer CH. The data storage layer may come in contact with the tunnel insulating layer. In addition, the blocking insulating layer may come in contact with the data storage layer. The tunnel insulating layer may be formed of a silicon oxide film. Further, the data storage layer may be formed of a material layer capable of trapping charge. For example, the data storage layer may be formed of a silicon nitride layer. The blocking insulating layer may include at least one of the silicon oxide layer and a high-k film having a higher dielectric permittivity than the silicon oxide layer. The multi-layer insulation film M may surround an entire outer wall of the channel layer CH. The multi-layer insulation film M may be formed in each of cross sections of the word lines WL_D and WL_S and the channel layer CH. The multi-layer insulation film M may extend along an upper side and a lower side of each of the word lines WL_D and WL_S. Gate insulating layers may be formed between the channel layer CH and the pipe gate PG, between the channel layer CH and the source select line SSL, and between the channel layer CH and the drain select line DSL.

According to the structure described above, a pipe transistor may be formed at a cross section of the pipe gate PG and the channel layer CH. Memory cells may be formed at cross sections of the word lines WL_D and WL_S and the channel layer CH. At least one source select transistor may be formed at a cross section of at least one source select line SSL and the channel layer CH. Further, at least one drain select transistor may be formed at a cross section of at least one drain select line DSL and the channel layer CH. As such, at least one drain select transistor, the memory cells, the pipe transistor, and at least one source select transistor are electrically coupled in series to form the memory string. The drain select transistor, the memory cells, the pipe transistor, and the source select transistor may be stacked between the bit line BL and the source line SL to obtain a three-dimensional cell structure.

In an embodiment, a semiconductor apparatus may be manufactured as described in FIGS. 2A through 2G to increase the number of stacked memory cells of a memory string.

FIGS. 2A through 2G are cross-sectional views illustrating a method to manufacture a semiconductor apparatus according to an embodiment.

Referring to FIG. 2A, a first interlayer insulating layer 103 may be formed over a substrate 101 which includes a cell region A1 and a peripheral region A2. A first conductive layer may be formed over the first interlayer insulating layer. The first conductive layer may be etched thereafter, and a trench T may be formed. The trench T may be formed at the first conductive layer of the cell region A1. The trench T may be filled with a first sacrificial layer 107. The first sacrificial layer 107 may be formed of a material having an etch selectivity with respect to first material layers 121 and second material layers 123 to be formed subsequently. For example, the first sacrificial layer 107 may be formed of TiN. Thereafter, a second conductive layer may further be formed over the first sacrificial layer 107 and the first conductive layer. Thereafter, a pipe gate PG where the first sacrificial layer 107 is buried may be formed at the cell region A1 by etching the first conductive layer and the second conductive layer. Driving gates DG of transistors which make up a peripheral circuit may be formed at a peripheral region A2. The pipe gate PG may have a stacked structure where a first conductive pattern 105a and a second conductive pattern 109a are stacked. Each of the driving gates DG may have a stacked structure where a first conductive pattern 105b and a second conductive pattern 109b are stacked.

Source/drain regions 111 may be formed by injecting impurities into the substrate 101 open from both sides of each of the driving gates DG.

A second interlayer insulating layer 113 providing insulation between the pipe gate PG and the driving gates DG may be formed. The first material layers 121 and the second material layers 123 may be stacked alternately. The first material layers 121 may be formed at layers where third interlayer insulating layers are to be formed. The second material layers 123 may be formed at layers where word lines are to be formed. The second material layers 123 may be formed of a different material from the first material layers 121. In particular, the second material layers 123 may be formed of a material having an etch selectivity with respect to the first material layers 121. For instance, the first material layers 121 may be formed of an insulating material for third interlayer insulating layers. In addition, the second material layers 123 may be formed of a conductive material for word lines. Or the first material layers 121 may be formed of the insulating material for third interlayer insulating layers, and the second material layers 123 may be formed of an insulating material for sacrificial layers. An oxide film may be used for the insulating material for third interlayer insulating layers. Further, a nitride film having an etch selectivity with respect to the oxide film may be used for the insulating layer for sacrificial layers. Any one of a poly silicon layer, a metal silicide layer and a metal layer may be used for the conductive material for word lines.

Figure 2B:
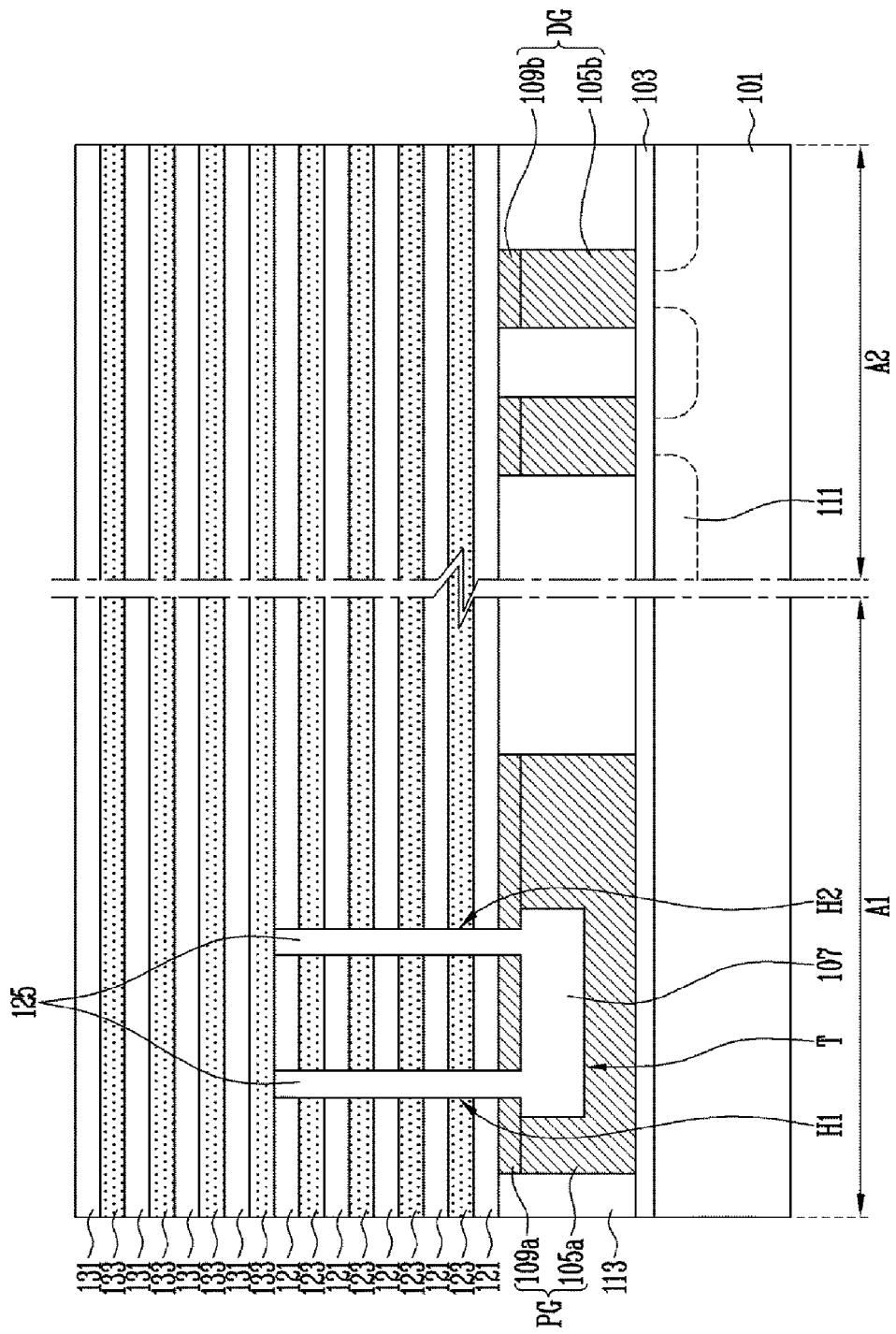

Referring to FIG. 2B, a first source side hole H1 and a first drain side hole H2 may be formed by etching the first material layers 121 and the second material layers 123. The first source side hole H1 and the first drain side hole H2 may be electrically coupled to the trench T. The second conductive pattern 109a of the pipe gate PG may be further etched. The first source side hole H1 and the first drain side hole H2 may open the first sacrificial layer 107 in the trench T. Insides of the first source side hole H1 and the first drain side hole H2 may be filled with second sacrificial layers 125. The second sacrificial layers 125 may be formed of a same material as the first sacrificial layer 107.

Third material layers 133 and fourth material layers 131 may be stacked alternately. The third material layers 133 may be formed at layers where the word lines, the source select line and the drain select line are to be formed. The source select line or the drain select line may be arranged at one or more layers from a topmost layer among the third materials layers 133. The fourth material layers 131 may be formed at layers where fourth interlayer insulating layers are to be formed. The third material layers 133 may be formed of the same material as the second material layers 123. The fourth material layers 131 may be formed of the same material as the first material layers 121.

Referring to FIG. 2C, the first to fourth material layers 121, 123, 133 and 131 may be patterned to have a stepped structure ST. The stepped structure ST may be formed by repeating an etch process in which an etch mask is used as an etch barrier and a process of reducing a size of the etch mask after forming the etch mask over the first to fourth material layers 121, 123, 133 and 131. In the etch process, at least two layers from the topmost layer of a region exposed by the etch mask may be etched. The etch process may be repeated until the lowermost layer of the first to fourth material layers 121, 123, 133 and 131 is etched. Whenever the etch process is repeated, the size of the etch mask is reduced. The etch mask may be a photoresist pattern patterned through a photolithography process. After the stepped structure ST is formed, the etch mask may be removed.

A fifth interlayer insulating layer 141 covering the driving gates DG and the stepped structure ST may be formed. After the fifth interlayer insulating layer 141 is formed, a surface of the fifth interlayer insulating layer 141 may be flattened using a flattening process such as a chemical mechanical polishing (CMP), etc.

Figure 2D:
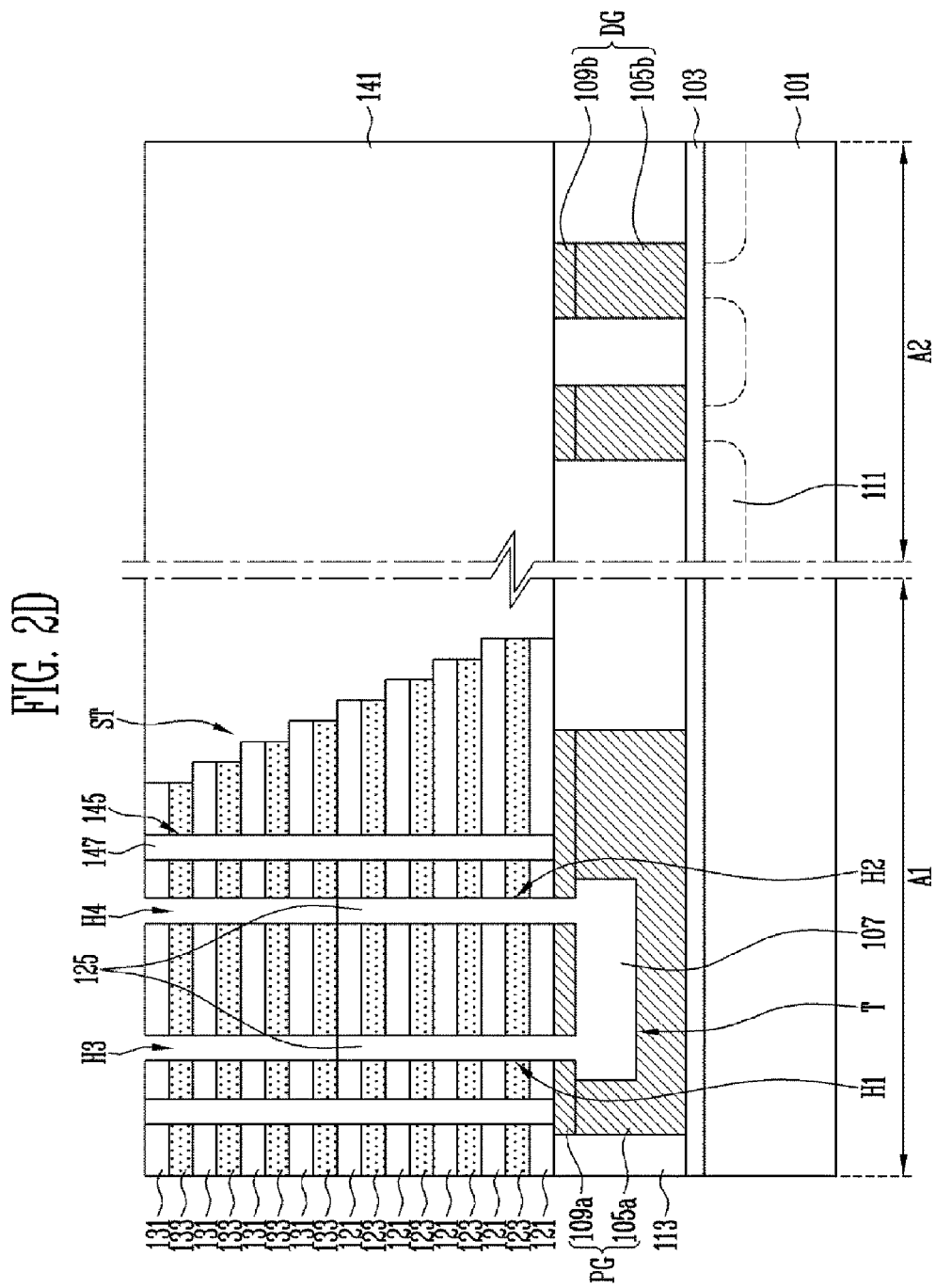

Referring to FIG. 2D, a first slit 145 that passes through the first through fourth material layers 121, 123, 133 and 131 may be formed by etching the first to fourth material layers 121, 123, 133 and 131. The first slit 145 may be formed in units of a memory block or a memory string. An inside of the first slit 145 may be filled with an insulating material 147. An oxide film may be used for the insulating material 147.

A second source side hole H3 electrically coupled to the first source side hole H1 and a second drain side hole H4 electrically coupled to the first drain side hole H2 may be formed by etching the third and fourth material layers 133 and 131. The second source side hole H3 and the second drain side hole H4 may open a second sacrificial layer 125. The second source side hole H3 and the second drain side hole H4 may be formed before the stepped structure ST or the first slit 145 is formed.

Referring to FIG. 2E, the first source side hole H1, the first drain side hole H2 and the trench T are opened by removing the first and second sacrificial layers 107 and 125.

A channel layer CH may be formed inside the second source side hole H3, the second drain side hole H4, the first source side hole H1, the first drain side hole H2 and the trench T. The channel layer CH may include a source side channel layer S_CH formed inside the first and second source side holes H1 and H3, a drain side channel layer D_CH formed inside the first and second drain side holes H2 and H4 and a pipe channel layer P_CH formed inside the trench T. The channel layer CH may be formed of a semiconductor material such as polysilicon. The channel layer CH may be formed in a tube shape along surfaces of the second source side hole H3, the second drain side hole H4, the first source side hole H1, the first drain side hole H2 and the trench T. A central region of the tube-shaped channel layer CH may be filled with the insulating material. The channel layer CH may be formed as a buried type burying the second source side hole H3, the second drain side hole H4, the first source side hole H1, the first drain side hole H2 and the trench T.

Before the channel layer CH is formed, a multi-layer insulation film M may be further formed along the surfaces of the second source side hole H3, the second drain side hole H4, the first source side hole H1, the first drain side hole H2 and the trench T. The multi-layer insulation film M may be formed of the same material and may have the same configuration as described in FIG. 1.

After the channel layer CH is formed, a capping conductive pattern CAP may be formed on an upper part of the channel layer CH. The capping conductive pattern CAP may be formed of doped polysilicon. If the central region of the channel layer CH is filled with the insulating material, the capping conductive pattern CAP may then be formed by filling a region from where the insulating material is removed with the doped polysilicon after some of the insulating material is removed. If the channel layer CH is formed as a buried type, the capping conductive pattern CAP may then be formed by doping the impurities on the upper part of the channel layer CH.

Referring to FIG. 2F, a second slit 151 may be formed. The second slit 151 may pass through the first to fourth material layers 121, 123, 133 and 131 by etching the first to fourth material layers 121, 123, 133 and 131 between the source side channel layer S_CH and the drain side channel layer D_CH. The second slit 151 may divide the first to fourth material layers 121, 123, 133 and 131 into a source side stacked body and a drain side stacked body.

If the second and third material layers 123 and 133 are formed of the conductive material, the second slit 151 may be filled with the insulating material and a conventional subsequent process may be performed.

If the second and third material layers 123 and 133 are formed of a sacrificial material, the second and third material layers 123 and 133 exposed through the second slit 151 may be removed as shown in FIG. 2G. In addition, regions from where the second and third material layers 123 and 133 are removed are filled with conductive patterns 153. The conductive patterns 153 may include at least one of a polysilicon layer, a metal silicide layer and a metal layer. If the conductive patterns 153 are formed of a metal layer such as tungsten, etc. which has a lower resistance than polysilicon, a barrier metal such as TiN may be further formed along surfaces of the conductive patterns 153.

The conductive patterns 153 may be used as word lines. At least one of the conductive patterns 153 from the topmost layer among the conductive patterns 153 may be used as a source select line or a drain select line. The second slit 151 may be filled with the insulating material and the conventional subsequent process may be performed.

As described above in an embodiment, after the first material layers 121 and the second material layers 123 passed through by the first source side hole H1 and the first drain side hole H2 are formed, the third and fourth material layers 133 and 131 passed through by the second source side hole H3 and the second drain side hole H4 may be additionally stacked. Accordingly, in an embodiment, the number of stacked memory cells of the memory string may increase and the degree of integration of a three-dimensional memory device may increase.

In an embodiment, source side holes may be divided into the first source side hole H1 passing through the first material layers 121 and the second material layers 123 and the second source side hole H3 passing through the third material layers 133 and the fourth material layers 131. In an embodiment, drain side holes may be divided into the first drain side hole H2 passing through the first material layers 121 and the second material layers 123 and the second drain side hole H4 passing through the third material layers 133 and the fourth material layers 131. An embodiment may enhance stability of a hole forming process because an aspect ratio of a hole may be reduced compared against a case in which the source side hole and the drain side hole passing through the first through fourth material layers 121, 123, 133 and 131, all together, are formed after the first to fourth material layers 121, 123, 133 and 131 are stacked.

Figure 3A:
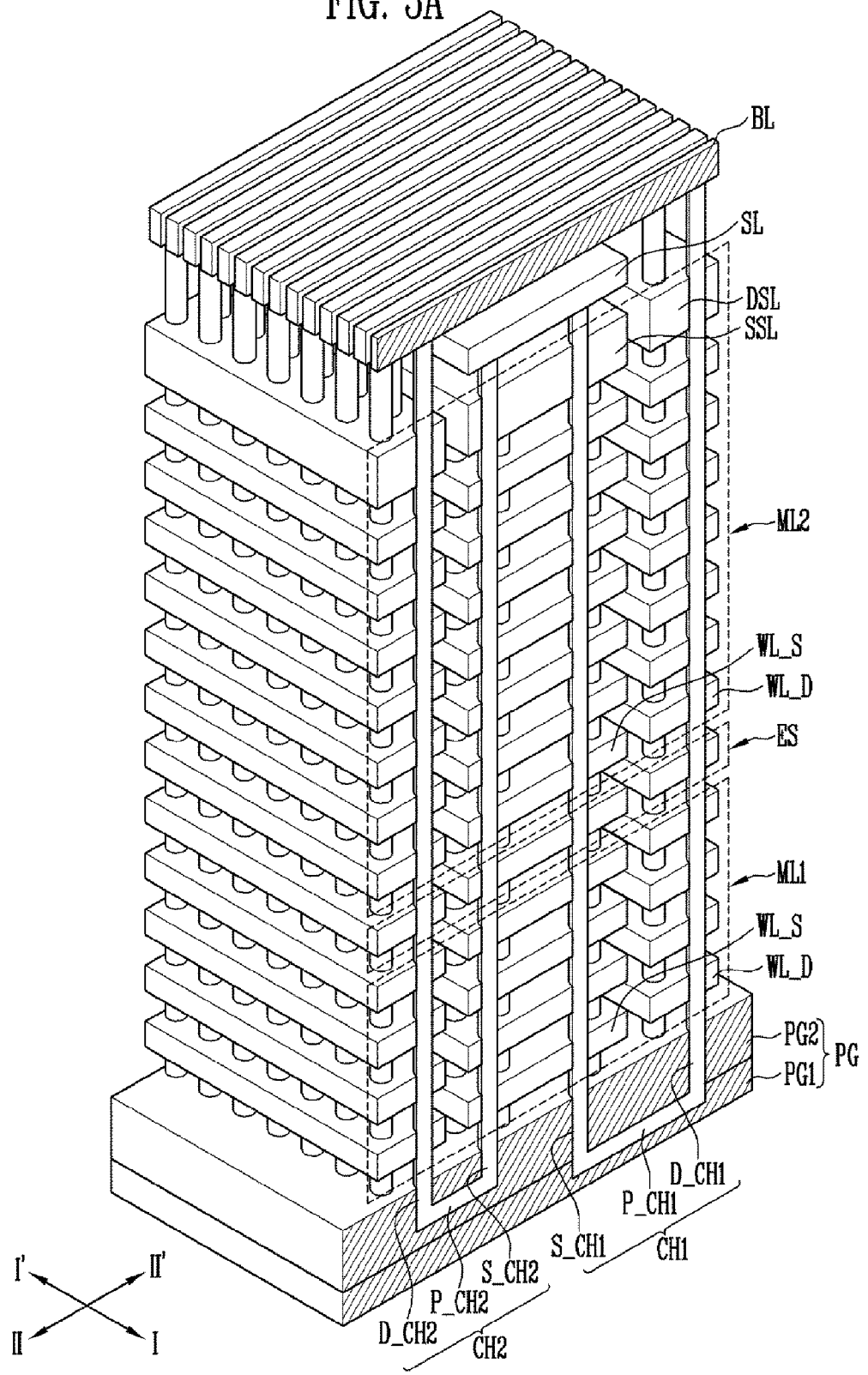
Figure 3B:
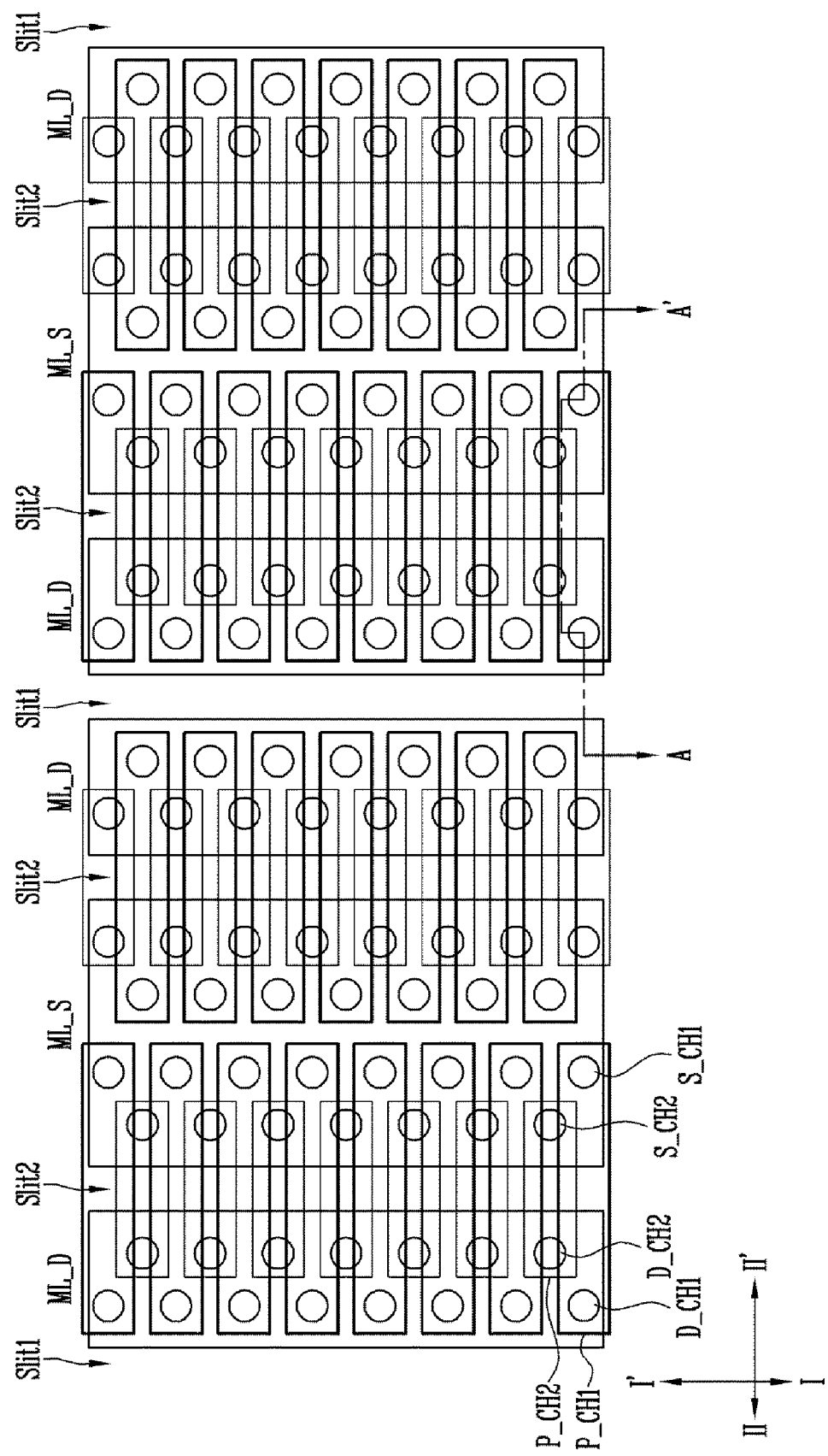

FIGS. 3A through 3C are views illustrating a semiconductor apparatus according to an embodiment. FIG. 3A, a perspective view illustrating a semiconductor apparatus according to an embodiment is shown. FIG. 3B is a layout diagram illustrating a semiconductor apparatus according to an embodiment. In addition, FIG. 3C is a view illustrating coupling between channel layers and a source line and coupling between channel layers and a bit line.

Referring to FIG. 3A, the semiconductor apparatus according to an embodiment may include a first channel layer CH1, a second channel layer CH2, a pipe gate PG, a first stacked body ML1, an etch stop layer ES and a second stacked body ML2. The first stacked body ML1, the etch stop layer ES and the second stacked body ML2 may be sequentially stacked over the pipe gate PG. The etch stop layer ES may be formed between the first stacked body ML1 and the second stacked body ML2. The second stacked body ML2 may be formed by stacking a greater number of material layers than that of material layers of the first stacked body ML1. The second stacked body ML2 may be taller than the first stacked body ML1.

The first stacked body ML1, the etch stop layer ES and the second stacked body ML2 may be divided into a source side stacked body and a drain side stacked body by a slit. The source side stacked body may include source side word lines WL_S and at least one source select line SSL over an upper side of the source side word lines WL_S. The drain side stacked body may include drain side word lines WL_D and at least one drain select line DSL over an upper side of the drain side word lines WL_D. The etch stop layer ES may be divided into the source side word line WL_S and the drain side word line WL_D or may be divided into insulating patterns, by the slit. For instance, if the etch stop layer ES is formed of a conductive layer, the etch stop layer ES may be divided into the source side word line WL_S and the drain side word line WL_D by the slit. If the etch stop layer ES is formed of an insulating material, the etch stop layer ES may then be divided into the insulating patterns by the slit.

The first channel layer CH1 may include the first pipe channel layer P_CH1 and the first source side channel layer S_CH1 and the first drain side channel layer D_CH1 protruding from the first pipe channel layer P_CH1. The second channel layer CH2 may include the second pipe channel layer P_CH2 and the second source side channel layer S_CH2 and the second drain side channel layer D_CH2 protruding from the second pipe channel layer P_CH2. The second channel layer CH2 may be provided at a location higher than the first channel layer CH1.

The pipe gate PG may include a first pipe gate PG1 and a second pipe gate PG2 over the first pipe gate PG1. The first and second pipe channel layers P_CH1 and P_CH2 may be buried in the pipe gate PG. The first pipe channel layer P_CH1 may be buried in the first pipe gate PG1. In addition, the second pipe channel layer P_CH2 may be buried in the second pipe gate PG2. The second pipe channel layer P_CH2 may be provided at a position higher than the first pipe channel layer P_CH1 and may be formed shorter than the first pipe channel layer P_CH1.

The first source side channel layer S_CH1 and the second source side channel layer S_CH2 may pass through a source side stacked body including source side word lines WL_S and the source select line SSL. The first source side channel layer S_CH1 and the second source side channel layer S_CH2 may be electrically coupled to the source line SL. The first drain side channel layer D_CH1 and the second drain side channel layer D_CH2 may pass through the drain side stacked body including the drain side word lines WL_D and the drain select line DSL. The first drain side channel layer D_CH1 and the second drain side channel layer D_CH2 may be electrically coupled to a bit line BL.

The first channel layer CH1 and the second channel layer CH2 may be formed in a tube shape in which a central region of the through-hole is open as shown in FIG. 1, as a buried shape in which the central region of the through-hole is buried or as a mixed shape in which the tube shape and the buried shape are mixed. The first channel layer CH1 and the second channel layer CH2 may be surrounded by a multilayer insulation film as shown in FIG. 1.

A pipe transistor may be formed at a cross section of the pipe gate PG and the first channel layer CH1 or a cross section of the pipe gate PG and the second channel layer CH2. Memory cells may be formed at cross sections of the word lines WL_D and WL_S and the first channel layer CH1. Memory cells may be formed at cross sections of the word lines WL_D and WL_S and the second channel layer CH2. A source select transistor may be formed at a cross section of the source select line SSL and the first channel layer CH1 or at a cross section of the source select line SSL and the second channel layer CH2. A drain select transistor may be formed at a cross section of the drain select line DSL and the first channel layer CH1 or at a cross section of the drain select line DSL and the second channel layer CH2. The drain select transistor, the memory cells, the pipe transistor and the source select transistor are electrically coupled in series to comprise a memory string. The drain select transistor, the memory cells, the pipe transistor, and the source select transistor may be stacked between the bit line BL and the source line SL to obtain a three-dimensional cell structure.

Referring to FIG. 3B, the first pipe channel layer P_CH1 and the second pipe channel layer P_CH2 may be arranged in a matrix shape along a first direction I-I' and a second direction II-II' crossing the first direction I-I'. The first pipe channel layer P_CH1 and the second pipe channel layer P_CH2 may be arranged alternately along the first direction I-I'. The first pipe channel layer P_CH1 and the second pipe channel layer P_CH2 may be arranged alternately along the second direction II-II'.

In an embodiment, the first pipe channel layer P_CH1 and the second pipe channel layer P_CH2 of different lengths and different heights may be alternately arranged along the first direction I-I' and the second direction II-II'. Further, in an embodiment, compared to the pipe channel layers having the same heights and the same lengths, the first pipe channel layer P_CH1 and the second pipe channel layer P_CH2 may be arranged more densely. As a result, the degree of integration for the memory device may be enhanced. The first pipe channel layer P_CH1 and the second pipe channel layer P_CH2 alternately arranged along the first direction I-I' may partially overlap each other.

The drain side stacked body ML_D may surround the first and second drain side channels D_CH1 and D_CH2 and may extend along the first direction I-I'. The source side stacked body ML_S may surround the first and second source side channel layers S_CH1 and S_CH2 and may extend along the first direction I-I'.

The drain side stacked body ML_D may surround at least a drain side channel layer D_CH1 in a line and at least a second drain side channel layer D_CH2 in a line. The drain side stacked body ML_D may be separated by the first slit Slit1. The first slit Slit1 may be formed in units of a memory block.

The drain side stacked body ML_D and the source side stacked body ML_S may be separated by a second slit Slit2.

The source side stacked body ML_S may be formed having wider widths than the drain side stacked body ML_D. For instance, the source side stacked body ML_S may surround the first source side channel layer S_CH1 in a second row and the second source side channel layer S_CH2 in a second row. Further, the drain side stacked body ML_D and the source side stacked body ML_S may be formed having same widths.

The slits Slit1 and Slit2 may vary in shape and arrangement. The arrangement of the drain side stacked body ML_D and the source side stacked body ML_S may change in a various manner.

Referring to FIG. 3C, the source line SL and the first and second slits Slit1, Slit2 may extend along the first direction I-I', and the bit line BL may extend along the second direction II-II'. The first channel layer CH1 and the second channel layer CH2 alternately arranged along the second direction II-II' may be electrically coupled to the bit line BL in common. The bit line BL may be electrically coupled to the first drain side channel layer D_CH1 of the first channel layer CH1 and the second drain side channel layer D_CH2 of the second channel layer CH2. The first source side channel layer S_CH1 and the second source side channel layer S_CH2 between the second slits Slit2 may be electrically coupled to the source line SL in common.

In an embodiment, a semiconductor apparatus may be manufactured using a method shown in FIGS. 4A through 5C to increase the number of stacked memory cells of a memory string.

FIGS. 4A through 4F are perspective views illustrating a process of forming second holes from a process of forming a pipe gate.

Figure 4A:
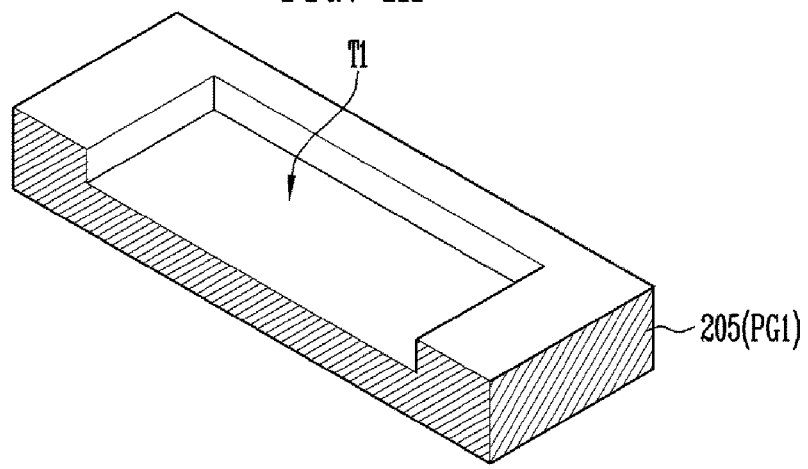
FIGS. 4A through 5C are views illustrating a semiconductor apparatus according to an embodiment.

Referring to FIG. 4A, a first pipe gate PG1 may be formed of a first conductive layer 205. The first pipe gate PG1 may be a portion surrounding the first pipe channel layer to be formed subsequently. Thereafter, a first trench T1 may be formed by etching the first pipe gate PG1.

Figure 4B:
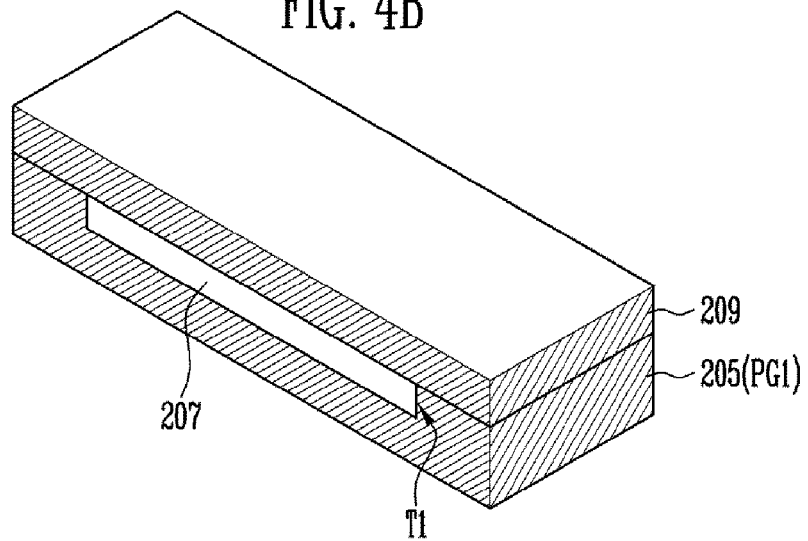

Referring to FIG. 4B, an inside of the first trench T1 may be filled with a first sacrificial layer 207. TiN may be used for the first sacrificial layer 207. Subsequently, a second conductive layer 209 may be formed over the first pipe gate PG1 where the first sacrificial layer 207 is buried.

Figure 4C:
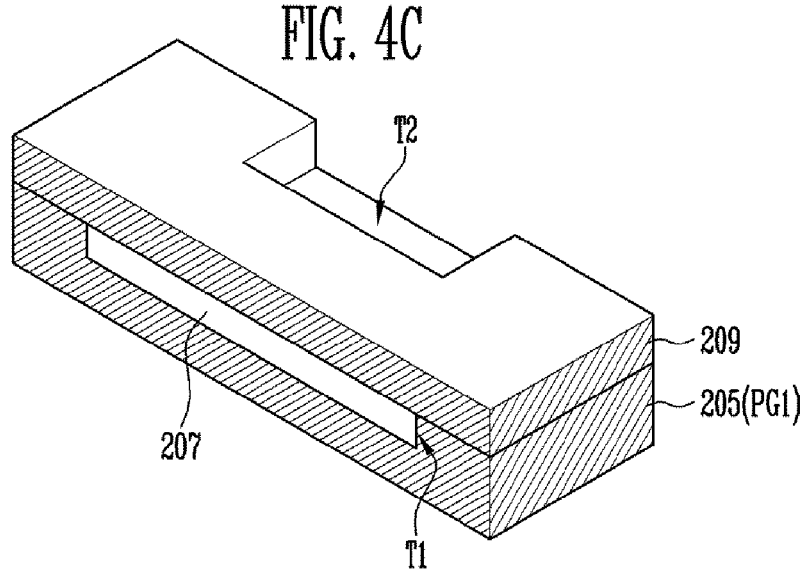

Referring to FIG. 4C, the second trench T2 may be formed by etching the second conductive layer 209. A depth of the second trench T2 may be smaller than a thickness of the second conductive layer 209. The second trench T2 may be formed shorter than the first trench T1. The first and second trenches T1 and T2 may define a region where the first and second pipe channel layers are formed.

Figure 4D:
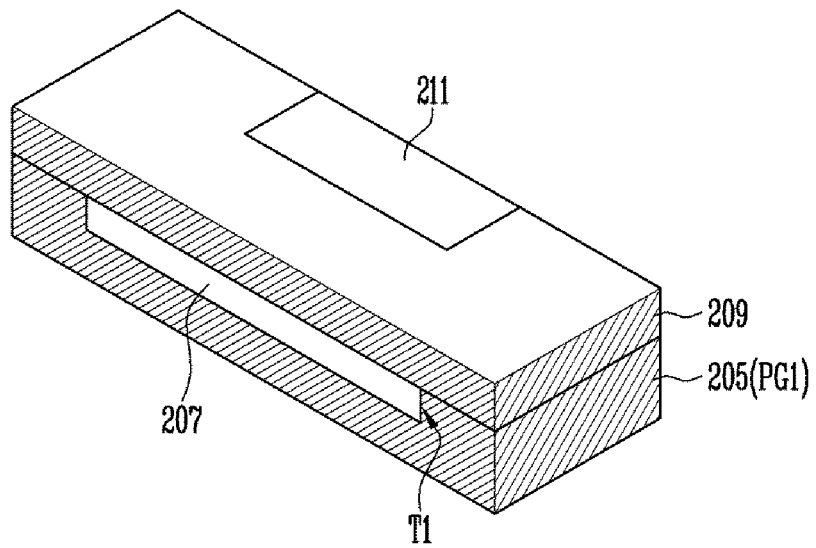

Referring to FIG. 4D, the second trench T2 may be filled with the second sacrificial layer 211. TiN may be used for the second sacrificial layer 211.

Figure 4E:
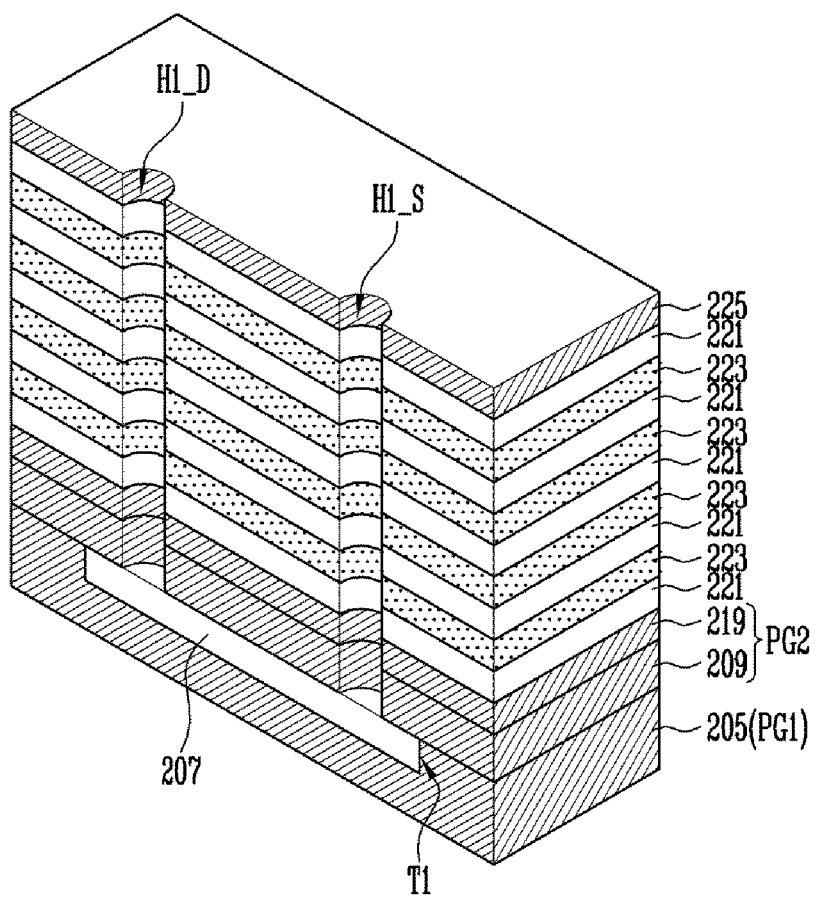

Referring to FIG. 4E, a third conductive layer 219 may be further formed over the second conductive layer 209 filled with the second sacrificial layer 211. The second and third conductive layers 209 and 219 may be used as a second pipe gate PG2. The second pipe gate PG2 may be a portion surrounding the second pipe channel layer to be formed subsequently.

The first material layers 221 and the second material layers 223 may be alternately stacked. The first material layers 221 and the second material layers 223 may be formed to increase the number of stacked memory cells. The first material layers 221 may be formed at layers to be formed where the interlayer insulating layers are to be formed. The second material layers 223 may be formed at layers where the word lines are to be formed. The first material layers 221 and the second material layers 223 may be formed of the same materials as described in FIG. 2A.

An etch stop layer 223 may be further formed over the first material layers 221 and the second material layers 223. The etch stop layer 223 may be formed of a material having an etch selectivity with respect to the first material layers 221 and the second material layers 223. For instance, the etch stop layer 223 may include a polysilicon layer or an $Al_2O_3$ layer.

First holes H1_D and H1_S that pass through the etch stop layer 223, the first material layers 221, the second material layers 223 and a second pipe gate PG2 may be formed by etching the etch stop layer 223, the first material layers 221, the second material layers 223 and the second pipe gate PG2. The first holes H1_D and H1_S may include a first drain side hole H1_D and a first source side hole H1_S. The first holes H1_D and H1_S may be formed to open the first sacrificial layer 207.

Figure 4F:
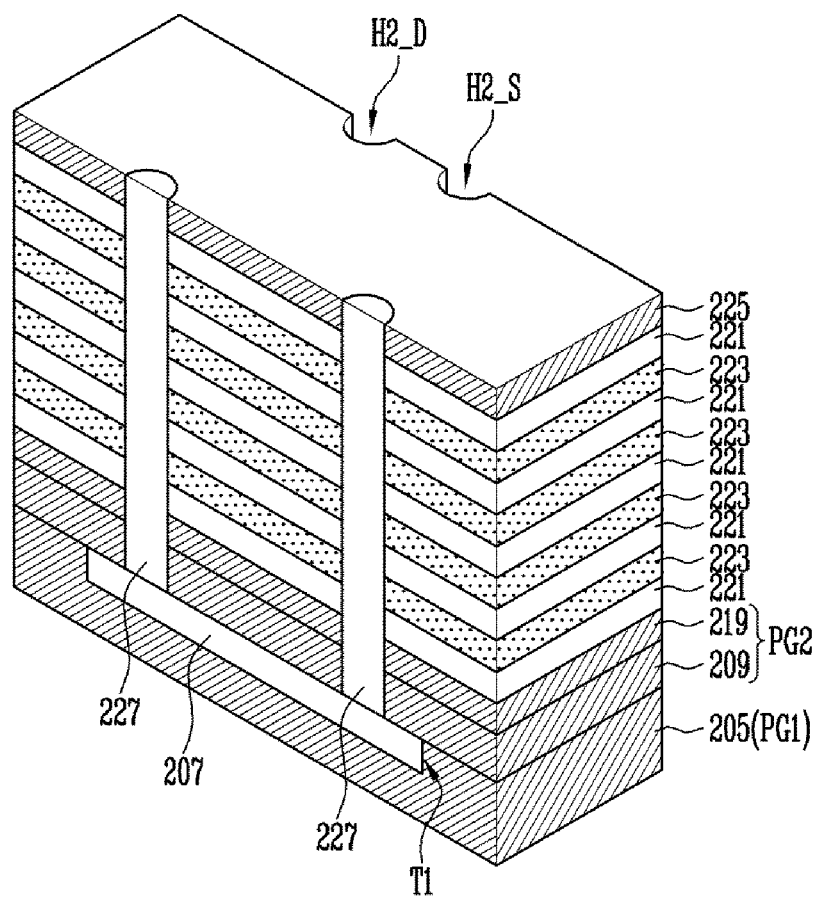

Referring to FIG. 4F, the first holes H1_D and H1_S may be formed with third sacrificial layers 227. TiN may be used for the third sacrificial layers 227.

Second holes H2_D and H2_S passing through the etch stop layer 223, the first material layers 221 and the second material layers 223 may be formed by etching the etch stop layer 223, the first material layers 221 and the second material layers 223. The second holes H2_D and H2_S may include the second drain side hole H2_D and the second source side hole H2_S. The second holes H2_D and H2_S may be formed to open the second sacrificial layer 211.

Figure 5A:
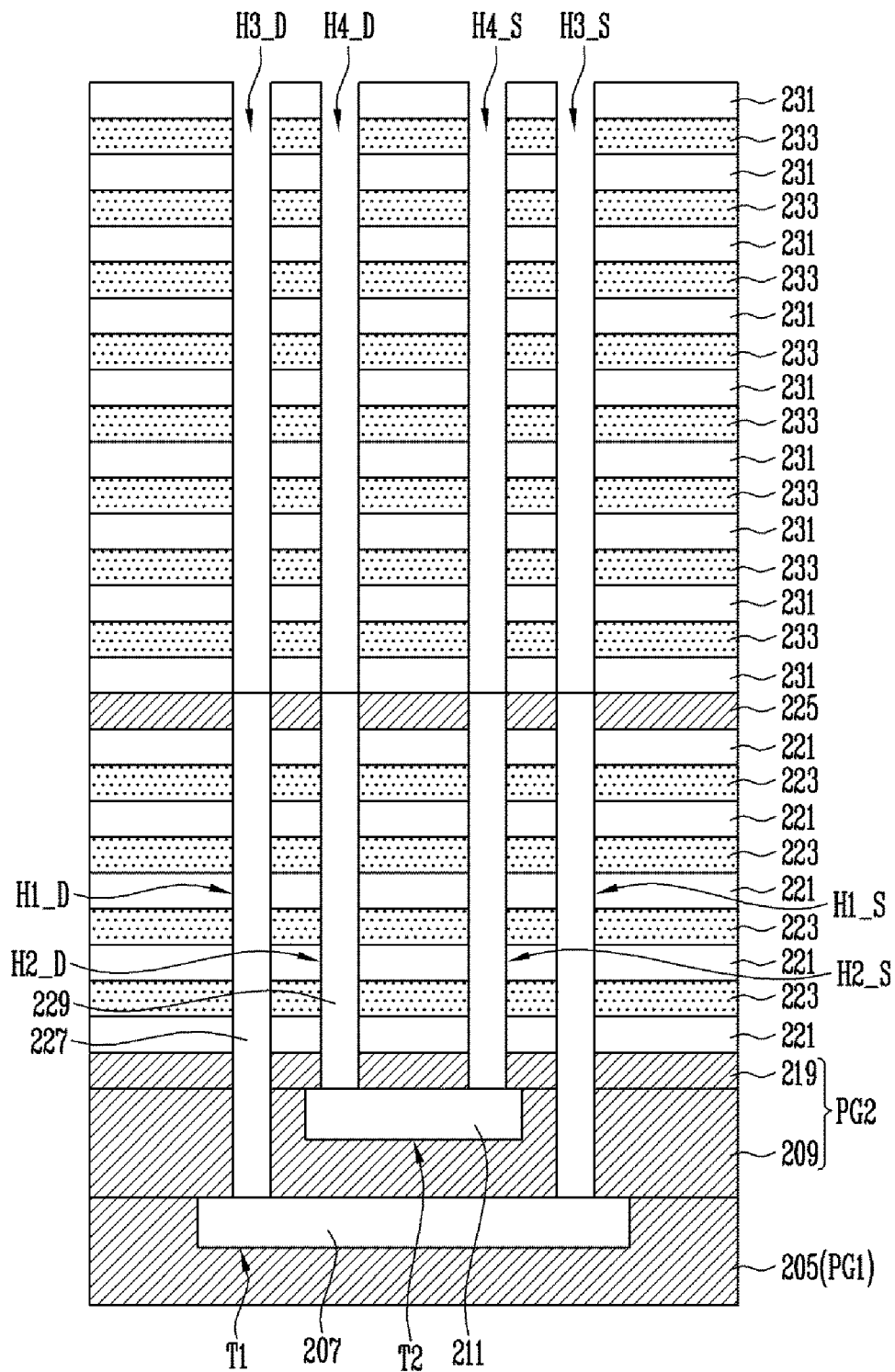
Figure 5B:
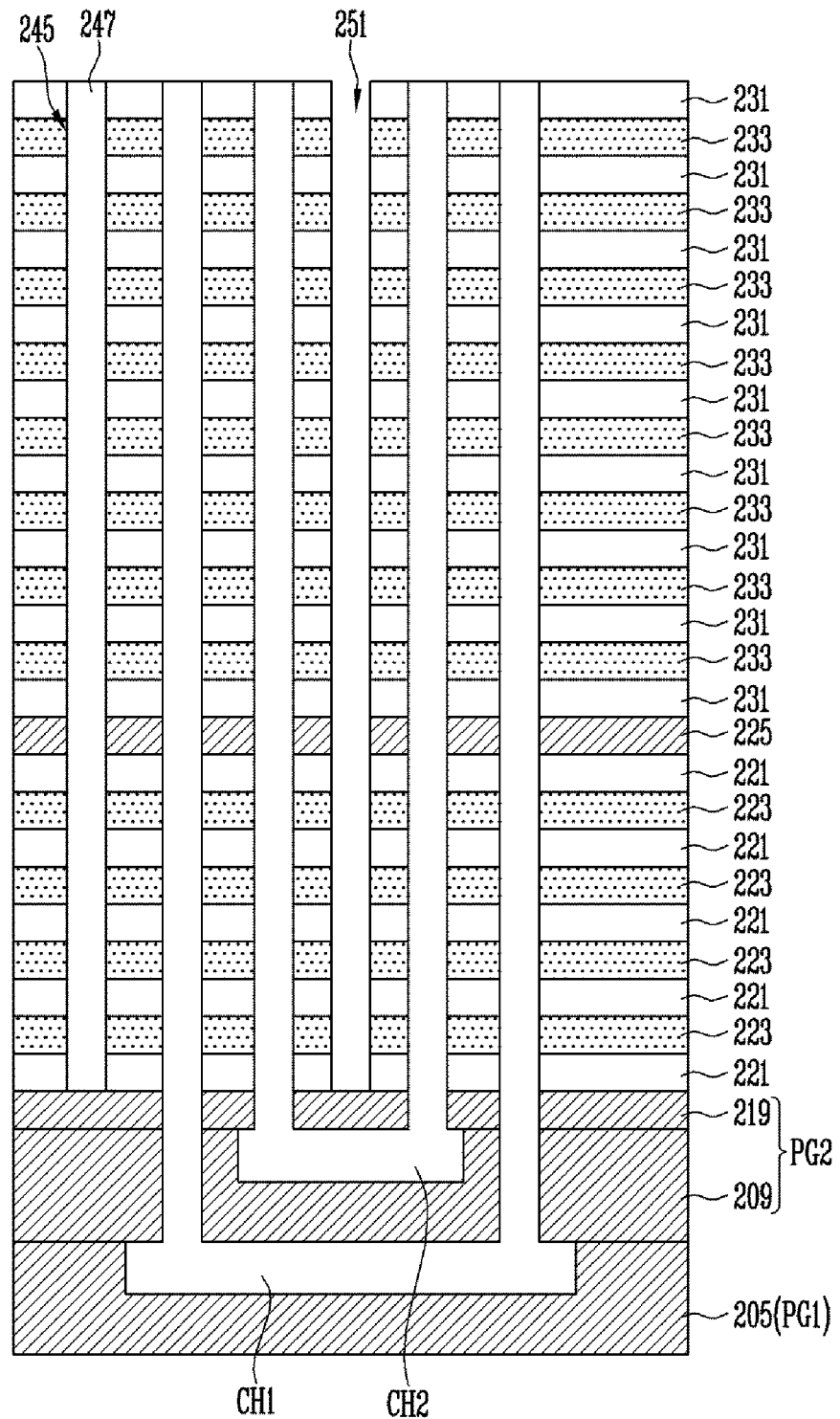
Figure 5C:
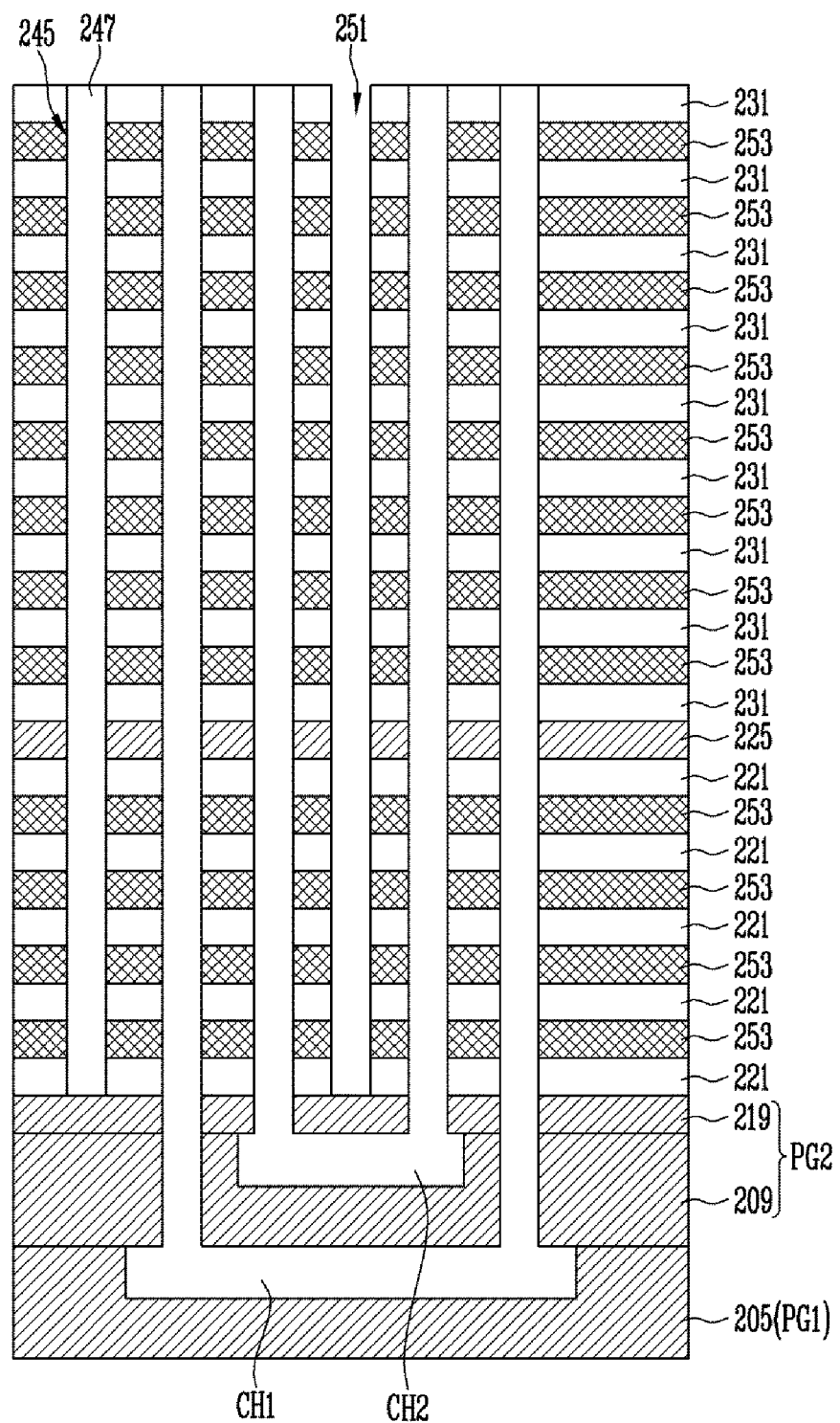

FIGS. 5A through 5C are cross-sectional views illustrating subsequent processes occurring after FIG. 4F. FIGS. 5A through 5C illustrate a cross section along a line "A-A" shown in FIG. 3B.

Referring to FIG. 5A, the second holes H2_D and H2_S may be filled with fourth sacrificial layers 229. TiN may be used for the fourth sacrificial layers 229.

Third material layers 231 and fourth material layers 233 may be alternately stacked over the third and fourth sacrificial layers 227 and 229 and the etch stop layer 225. The third material layers 231 may be formed of the same material as the first material layers 221. The fourth material layers 233 may be formed of the same material as the second material layers 223. The number of stacked layers of the third material layers 231 and the fourth material layers 233 may be greater than the number of stacked layers of the first material layers 221 and the second material layers 223.

The third holes H3_D and H3_S and the fourth holes H4_D and H4_S passing through the third and fourth material layers 231 and 233 may be formed by etching the third and fourth material layers 231 and 233. An etch process to form the third holes H3_D and H3_S and the fourth holes H4_D and H4_S may be stopped when an etch stop layer 225 is exposed. Accordingly, damage to lower side layers of the etch stop layer 225 may be prevented.

The third holes H3_D may include the third source side hole H3_S electrically coupled to the first source side hole H1_S and the third drain side hole H3_D electrically coupled to the first drain side hole H1_D. The third holes H3_D and H3_S may open the third sacrificial layers 227.

The fourth holes H4_D and H4_S may include the fourth drain side hole H4_D electrically coupled to the second drain side hole H2_D and the fourth side hole H4_S electrically coupled to the second source side hole H2_S. The fourth holes H4_D and H4_S may open the fourth sacrificial layers 229.

Referring to FIG. 5B, first and second trenches T1 and T2 and first and second holes H1_S, H1_D, H2_S and H2_D may be opened by removing the first through fourth sacrificial layers 207, 211, 227 and 229. The first and second trenches T1 and T2 and the first through fourth holes H1_S, H1_D, H2_S, H2_D, H3_S, H3_D, H4_S and H4_D may be filled with a semiconductor layer such as polysilicon, etc. Consequently, the first and second channel layers CH1 and CH2 may be formed.

The first and second channel layers CH1 and CH2 may be formed in a tube shape or a buried shape as described in FIG. 2E. A multi-layer insulation film M may be further formed as shown in FIG. 2E before the first and second channel layers CH1 and CH2 are formed.

A first slit 245 passing through the first through fourth material layers 221, 223, 231 and 233 may be formed by etching the first through fourth material layers 221, 223, 231 and 233. The first slit 245 may be formed in units of a memory block. An inside of the first slit 245 may be filled with the insulating material 247.

A second slit 251 passing through the first through fourth material layers 221, 223, 231 and 233 may be formed by etching the first through fourth material layers 221, 223, 231 and 233. The first through fourth material layers 221, 223, 231 and 233 may be divided into the source side stacked body and the drain side stacked body through the second slit 251.

The arrangement and the shape of the first and second slits 245 and 251 may be substantially similar as described in FIGS. 3B and 3C.

If the second and fourth material layers 223 and 233 are formed of the conductive materials, the second slit may be filled with the insulating material and the conventional subsequent process may be performed.

If the second and fourth material layers 223 and 233 are formed of the sacrificial materials shown in FIG. 5C, a region from where the second and fourth material layers 223 and 233 are removed is filled with conductive patterns 253 after removing the second and fourth material layers 223 and 244 exposed through the second slit 251. The conductive patterns 253 may include at least any one of a polysilicon layer, a metal silicide layer and a metal layer. If the conductive patterns 253 are formed of a metal layer with a lower resistance than polysilicon such as tungsten, etc., a barrier metal such as TiN may then be further formed along surfaces of the conductive patterns 253.

The etch stop layer 225, a first stacked body including conductive patterns 223 or 253 and the interlayer insulating layers 221 are alternately stacked. Further, the second stacked body including the conductive patterns 233 or 253 and the interlayer insulating layers 231 may be divided into a source side stacked body and a drain side stacked body.

In an embodiment, the number of stacked layers of memory cells may be increased through the first stacked body.

FIGS. 6A to 6D are cross-sectional views illustrating a method to form a pipe gate according to an embodiment.

Figure 6A:
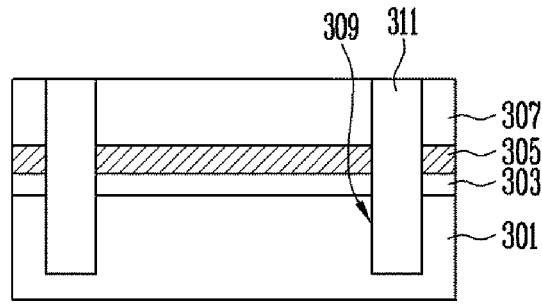
FIGS. 6A to 6D are cross-sectional views illustrating a method for forming a pipe gate according to an embodiment.

Referring to FIG. 6A, an interlayer insulating layer 303, a first conductive layer 305 and an isolation mask pattern 307 may be stacked on a substrate 301. The isolation mask pattern 307 may be formed of a material having an etch selectivity with respect to the interlayer insulating layer 303 and the first conductive layer 305. For example, the interlayer insulating layer 303 may include an oxide layer, the first conductive layer 305 may include polysilicon, and the isolation mask pattern 307 may include a nitride layer.

An isolation trench 309 may be formed by etching the first conductive layer 305, the interlayer insulating layer 303 and the substrate 301 using the isolation mask pattern 307 as an etch barrier. The isolation trench 309 may be formed in a mesh shape. After an inside of the isolation trench 309 is filled with an insulating material, a surface of the insulating material may be flattened to form an isolation layer 311 until the isolation mask pattern 307 is exposed. The isolation layer 311 may be formed higher than the first conductive layer 305 such that the isolation layer 311 may be protruded to the upper side.

Figure 6B:
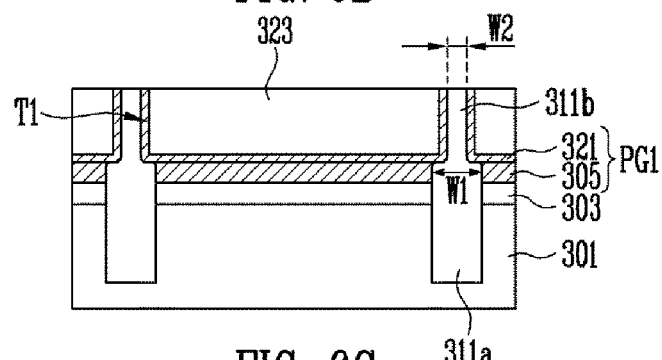

Referring to FIG. 6B, the isolation mask pattern 307 may be removed. A process to remove part of sidewalls of the isolation layer 311 exposed to an upper side of the first conductive layer 305 may be carried out further. The isolation layer 311 may be divided into a first region 311a having a first width W1 contacting the first conductive layer 305 and a second region 311b having a second width W2 narrower than the first width W1 electrically coupled to the first region 311a. As the second region 311b is formed narrower, an area where the first trench T1 is to be formed subsequently may be secured wider.

A second conductive layer 321 may be formed along surfaces of an area where the isolation mask pattern 307 is removed. More specifically, the second conductive layer 321 may be formed along the sidewalls of the isolation layer 311 protruding above the first conductive layer 305 and a top surface of the first conductive layer 305. The second conductive layer 321 may include a first trench T1 at the location from where the isolation mask pattern 307 is removed. The first trench T1 may be opened. The second conductive layer 321 may be in contact with the second region 311b of the isolation layer 311. An inside of the first trench T1 may be filled with a first sacrificial layer 323. Surfaces of the first sacrificial layer 323 and the second conductive layer 321 may be flattened until the isolation layer 311 is exposed. The first conductive layer 305 and the second conductive layer 321 divided by the isolation layer 311 may be used as a pipe gate PG1. The pipe gate PG1 may include the first trench T1 wherein the first sacrificial layer 323 may be buried inside.

The first trench T1 of the first pipe gate PG1 may be defined by the layout of the isolation layer 311 without an additional mask process to etch the first conductive layer 305 being performed. The isolation layer 311 is essential in various regions of the memory device to separate the device. Accordingly, no additional mask process needs to be performed to form the isolation layer 311 to define the first trench T1 and the layout of the isolation layer 311 may change to define the first trench T1. As a result, the mask process to form the first trench T1 may be omitted.

Figure 6C:
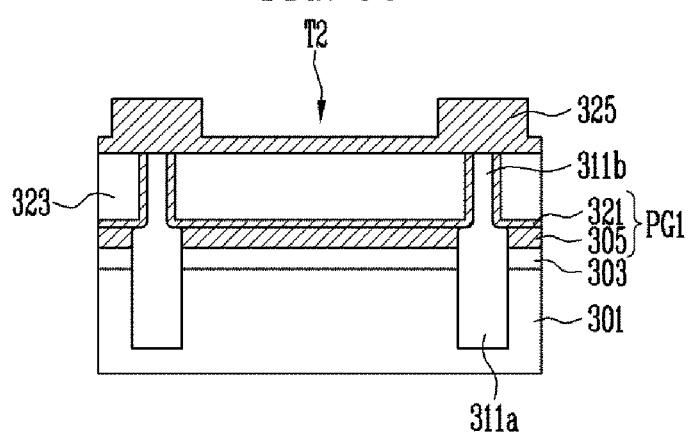

Referring to FIG. 6C, a third conductive layer 325 may be formed to cover the isolation layer 311 and the first pipe gate PG1 where the first sacrificial layer 323 is buried. The second trench T2 which is shorter than the first trench T1 may be formed by etching the third conductive layer 325. The arrangement of the first and second trenches T1 and T2 may be determined according to the layout of the first pipe channel layer and the second pipe channel layer described in FIGS. 3B and 3C.

Figure 6D:
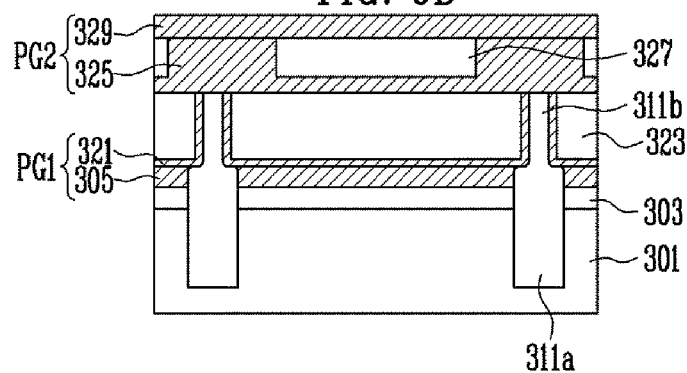

Referring to FIG. 6D, a second trench T2 may be filled with a second sacrificial layer 327. A fourth conductive layer 329 covering the second sacrificial layer 327 and the third conductive layer 325 may be formed. A second pipe gate PG2 may be formed. The second sacrificial layer 327 may be buried in the second pipe gate PG2.

The subsequent process may be substantially similar as what is described in FIGS. 4E through 5C.

TiN may be used for the first and second sacrificial layers 323 and 327.

In an embodiment, a first pipe channel layer P_CH1 in FIG. 3A may be buried inside the first pipe gate PG1. The first pipe gate PG1 may be divided by the isolation layer 311. A second pipe channel layer P_CH2 in FIG. 3A may be buried inside the second pipe gate PG2. The second pipe gate PG2 may cover the first pipe channel layer P_CH1, the first pipe gate PG1 and the isolation layer 311. The second pipe gate PG2 may be formed to be wider than the first pipe gate PG1.

Figure 7:
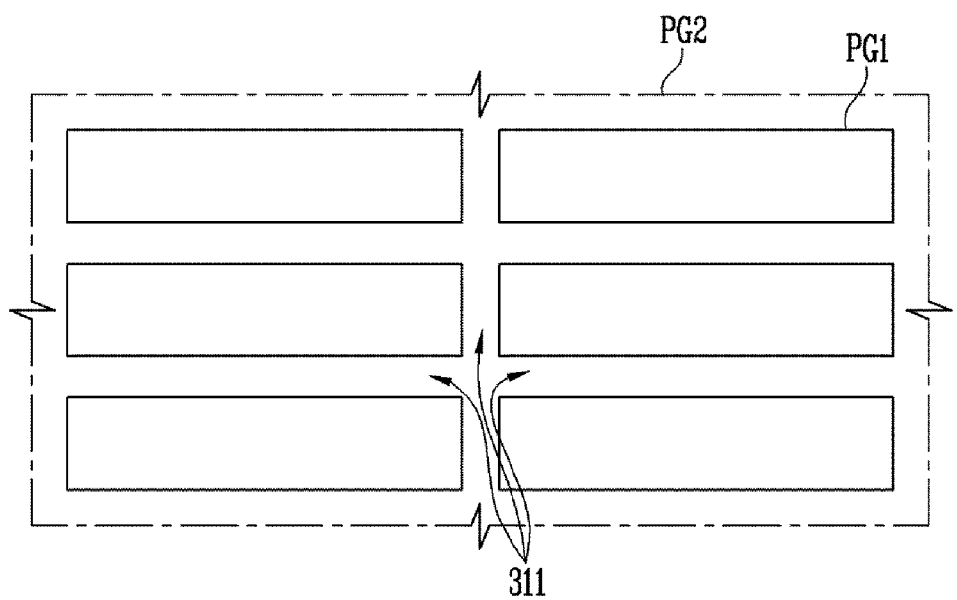
FIG. 7 is a view illustrating a layout of a pipe gate and a isolation layer.

FIG. 7 is a view illustrating a layout of a pipe gate and an isolation layer.

Referring to FIG. 7, the first pipe gates PG1 may be divided by the isolation layer 311 formed in a mesh shape and arranged in a matrix shape. The second pipe gate PG2 may be formed to be wider than each of the first pipe gates PG1 and provided over the first pipe gates PG1 and the isolation layer 311 formed in the mesh shape.

Figure 8:
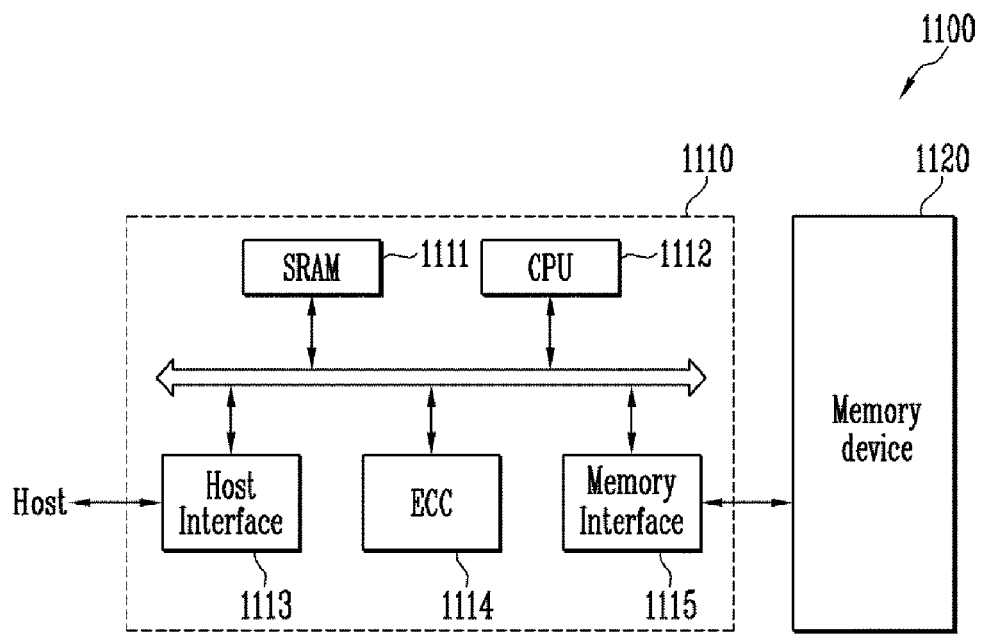
FIG. 8 is a block diagram illustrating a memory system according to an embodiment.

FIG. 8 is a block diagram illustrating a memory system according to an embodiment.

Referring to FIG. 8, in an embodiment, a memory system 1100 may include a memory device 1120 and a memory controller 1110.

The memory device 1120 may have a substantially similar structure described in the above embodiments described in FIGS. 1 through 7. Furthermore, the memory device 1120 may be a multi-chip package comprising a plurality of flash memory chips.

The memory controller 1110 may be configured to control the memory device 1120 and may include a SRAM 1111, a CPU 1112, a host interface 1113, an ECC 1114 and a memory interface 1115. The SRAM 1111 may be used as an operating memory of the CPU 1112. Further, the CPU 1112 may perform all types of control operations to exchange data of the memory controller 1110. The host interface 1113 may have a data exchange protocol of a host to which a memory system 1100 accesses. Moreover, ECC 1114 may detect and correct an error included in data read from the memory device 1120. The memory interface 1115 may perform interfacing with the memory device 1120. The memory controller 1110 may further include a ROM, etc. to store code data to interface with the host.

The memory system 1100 having such configuration may be a memory card where the memory device 1120 and the controller 1110 are combined or a solid state disk SSD. For example, if the memory system 1100 is the SSD, the memory controller 1110 may communicate with the outside (e.g., the host) through one of various interface protocols such as USB, MMC, PCI-E, SATA, PATA, SCSI, ESDI, IDE, etc.

Figure 9:
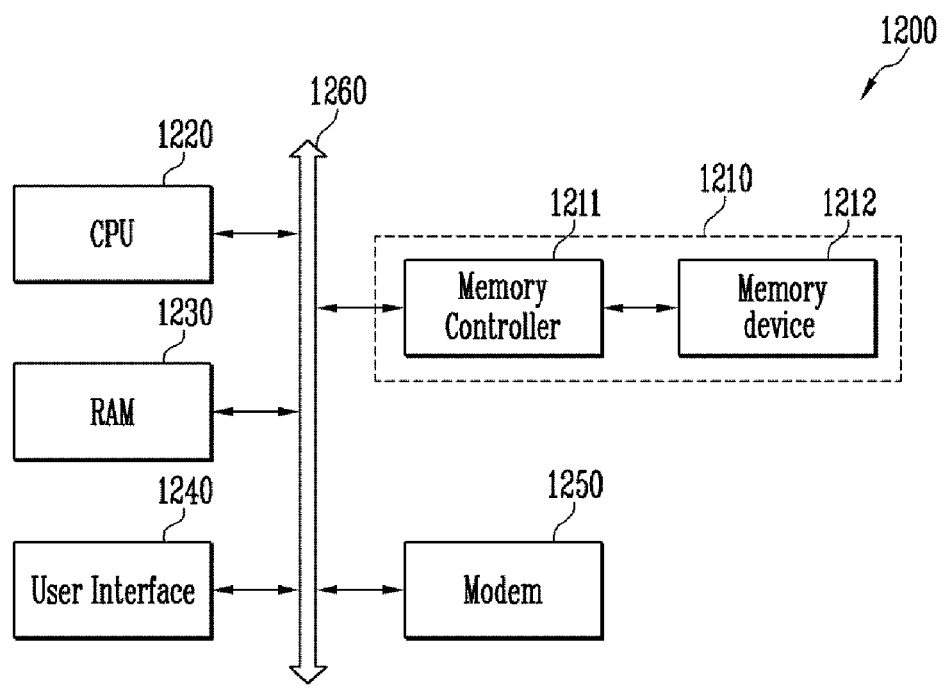
FIG. 9 is a block diagram illustrating a computing system according to an embodiment.

FIG. 9 is a block diagram illustrating a computing system according to an embodiment.

Referring to FIG. 9, the computing system 1200 in an embodiment may include a CPU 1220 electrically coupled to a system bus 1260, a RAM 1230, a user interface 1240, a modem 1250 and a memory system 1210. In addition, if the computing system 1200 is a mobile device, a battery to supply an operating voltage to the computing system 1200 may be further included. An application chip set, a camera image processor CIS, a mobile DRAM, etc. may be further included.

The memory system 1210 may include, as described in reference to FIG. 8, a memory device 1212 and a memory controller 1211.

While certain embodiments have been described above, it will be understood to those skilled in the art that the embodiments described are by way of example only. Accordingly, the semiconductor apparatus described should not be limited based on the described embodiments.

What is claimed is:

1. A semiconductor apparatus, comprising:
a first pipe gate divided by an isolation layer;
a first pipe channel layer buried in the first pipe gate;
a second pipe gate covering the first pipe channel layer, the first pipe gate and the isolation layer, wherein the second pipe gate is in contact with the first pipe gate and the isolation layer; and
a second pipe channel layer buried in the second pipe gate.

2. The semiconductor apparatus of claim 1, wherein an area of the second pipe gate is larger than that of the first pipe gate.

3. The semiconductor apparatus of claim 1, wherein the first pipe channel layer and the second pipe channel layer may be configured in a matrix shape along a first direction and a second direction crossing the first direction.

4. The semiconductor apparatus of claim 3, the first pipe channel layer and the second pipe channel layer are alternately arranged in the first direction.

5. The semiconductor apparatus of claim 3, wherein the first pipe channel layer and the second pipe channel layer are alternately arranged in the second direction.

6. The semiconductor apparatus of claim 1, wherein the second pipe channel layer is shorter than the first pipe channel layer.

7. The semiconductor apparatus of claim 1, wherein the first pipe gate comprises:
a first conductive layer being shallower than the isolation layer to allow sidewalls on an upper portion of the isolation layer to protrude above the first conductive layer; and
a second conductive layer formed along the sidewalls of the isolation layer protruding above the first conductive layer and a top surface of the first conductive layer, wherein the second conductive layer includes a first trench filled with the first pipe channel layer.

8. The semiconductor apparatus of claim 7, wherein the isolation layer comprises:
a first portion in contact with the first conductive layer; and
a second portion electrically coupled to the first portion in a narrower width than the first portion and in contact with the second conductive layer.

9. The semiconductor apparatus of claim 1, wherein the second pipe gate comprises:
a third conductive layer including a second trench to be filled with the second pipe channel layer and covering the first pipe gate and the first pipe channel layer; and
a fourth conductive layer covering the second pipe channel layer and the third conductive layer.

10. The semiconductor apparatus of claim 1, further comprising:
a first stacked body over the second pipe gate;
a second stacked body over the first stacked body with a greater height than the first stacked body;
an etch stop layer interposed between the first stacked body and the second stacked body; and
a slit dividing the second stacked body, the etch stop layer and the first stacked body into a source side stacked body and a drain side stacked body.

11. The semiconductor apparatus of claim 10, wherein the first stacked body and the second stacked body comprise alternately stacked interlayer insulating layers and conductive layers.

12. The semiconductor apparatus of claim 10, wherein the etch stop layer comprises an $Al_2O_3$ or a poly silicon layer.

13. The semiconductor apparatus of claim 10, further comprising:
a first source side channel layer passing through the source side stacked body and electrically coupled to the first pipe channel layer; and
a first drain side channel layer passing through the drain side stacked body and electrically coupled to the first pipe channel layer.

14. The semiconductor apparatus of claim 10, further comprising:
a second source side channel layer passing through the source side stacked body and electrically coupled to the second pipe channel layer; and
a second drain side channel layer passing through the drain side stacked body and electrically coupled to the second pipe channel layer.

* * * * *